United States Patent
Kojima et al.

[11] Patent Number: 5,995,429
[45] Date of Patent: Nov. 30, 1999

[54] SEMICONDUCTOR MEMORY DEVICE CAPABLE OF MULTIPLE WORD-LINE SELECTION AND METHOD OF TESTING SAME

[75] Inventors: Kazumi Kojima, Kasugai; Toshiya Uchida; Makoto Yanagisawa, both of Kawasaki, all of Japan

[73] Assignee: Fujitsu Limited, Kanagawa, Japan

[21] Appl. No.: 09/057,403

[22] Filed: Apr. 9, 1998

[30] Foreign Application Priority Data

May 30, 1997 [JP] Japan ................................. 9-142314
Jan. 8, 1998 [JP] Japan ................................. 10-002594

[51] Int. Cl.$^6$ ..................................................... G11C 7/00
[52] U.S. Cl. ................ 365/201; 365/230.06; 365/230.03
[58] Field of Search ............................. 365/201, 230.06, 365/200, 230.08, 230.03

[56] References Cited

U.S. PATENT DOCUMENTS

| | | | |
|---|---|---|---|
| 5,455,796 | 10/1995 | Inui et al. ................................ | 365/201 |
| 5,519,657 | 5/1996 | Arimoto ................................. | 365/200 |
| 5,574,693 | 11/1996 | Inui et al. ................................ | 365/201 |
| 5,615,164 | 3/1997 | Kirihata et al. ..................... | 365/230.06 |
| 5,619,460 | 4/1997 | Kirihata et al. ......................... | 365/201 |
| 5,652,725 | 7/1997 | Suma et al. ............................. | 365/200 |

FOREIGN PATENT DOCUMENTS

| | | |
|---|---|---|
| 0 600 160 A2 | 6/1994 | European Pat. Off. . |
| 0 747 906 A2 | 12/1996 | European Pat. Off. . |
| 58-128077 | 7/1983 | Japan . |
| 1-276500 | 11/1989 | Japan . |
| 2582587 | 11/1996 | Japan . |

OTHER PUBLICATIONS

"Generic DFT Approach for Pattern Sensitive Faults in Word-Oriented Memories", Amin et al, *IEE Proc.–Comput. Digit. Tech.*, vol. 143, No. 3, May 1996, pp. 199–202.

*Primary Examiner*—David Nelms
*Assistant Examiner*—Anh Phung
*Attorney, Agent, or Firm*—Nikaido, Marmelstein, Murray & Oram, LLP

[57] ABSTRACT

A semiconductor memory device capable of conducting test operations includes a plurality of word drivers which keep word lines in an active state when the word drivers are selected until the word drivers are reset. The semiconductor memory device further includes a control circuit which successively selects more than one of the plurality of word drivers so as to achieve simultaneous activation of word lines corresponding to selected ones of the plurality of word drivers during the test operations.

12 Claims, 20 Drawing Sheets

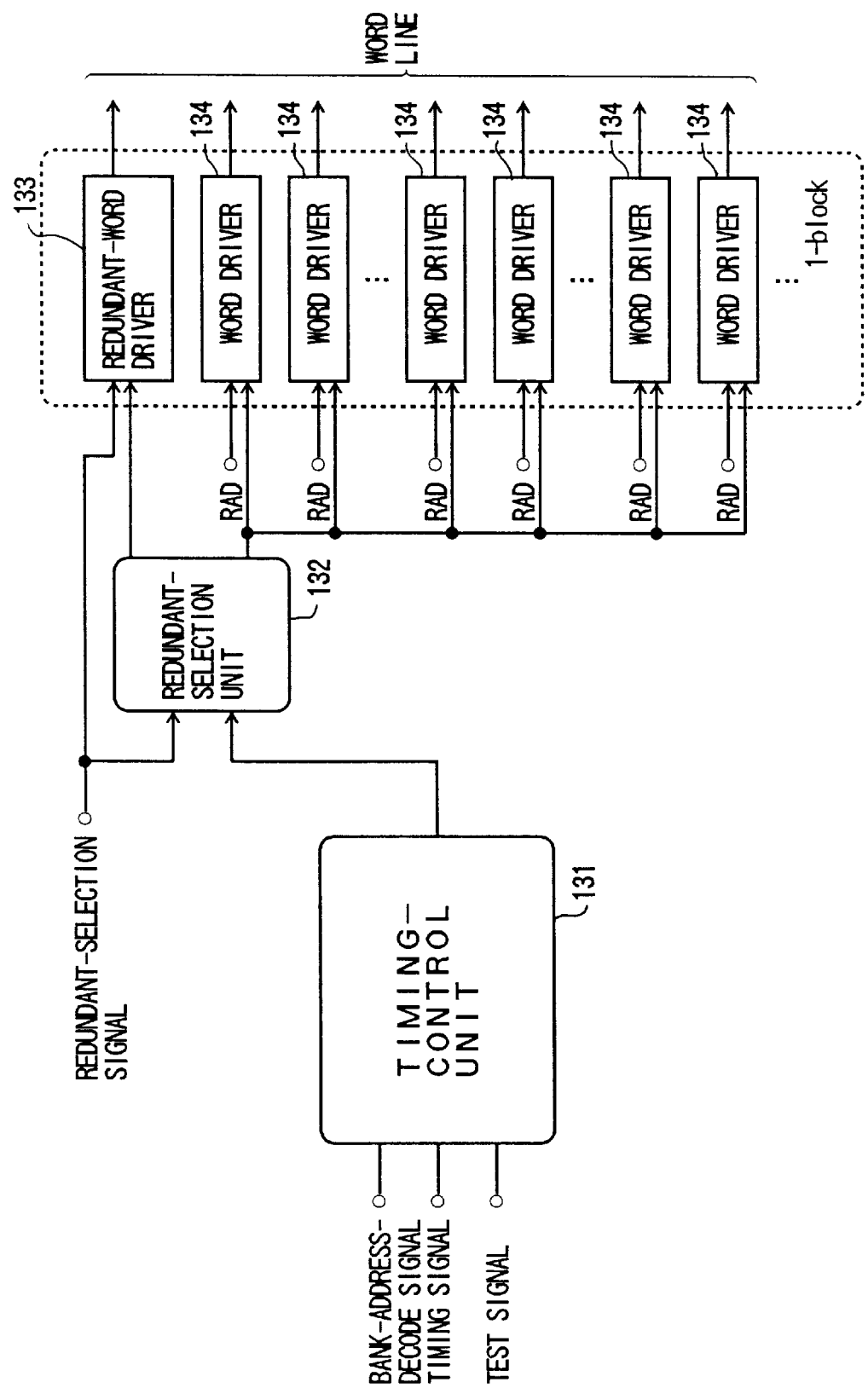
F I G. 1 2

SEMICONDUCTOR MEMORY DEVICE CAPABLE OF MULTIPLE WORD-LINE SELECTION AND METHOD OF TESTING SAME

BACKGROUND OF THE INVENTION

1. Field of the Invention

The present invention generally relates to semiconductor memory devices, and particularly relates to a semiconductor memory device provided with test functions to test memory cells.

2. Description of the Related Art

Semiconductor memory devices such as DRAMs are subjected to inspections to check whether memory cells correctly function with regard to data storage capacity. Such inspections are conducted at a site of manufacturers before shipment of products. A test referred to as a disturb test activates a given word line, and writes data of either 0 or 1 in a memory cell. The word line is then deactivated, and surrounding word lines are switched back and forth between an active state and an inactive state. After this operation, the word line is activated again to check whether the data initially stored in the memory cell can be correctly read. This test can evaluate whether data of a given word line is affected when surrounding word lines are driven.

In conventional DRAMs, each bank is provided with one row-address-latch circuit, which latches a row address. When a given bank is activated, therefore, only one row address can be accessed in this bank. In this manner, conventional DRAMs allow only one word line to be activated at one time. Because of this limitation, the disturb test described above needs to repeat activation and deactivation with respect to each word line by successively selecting each word line.

Development of integrated-circuit technology makes it possible to manufacture DRAMs of a larger memory capacity, and such DRAMs have a larger number of word lines. As DRAMs have a larger capacity, therefore a time length required for testing a DRAM becomes undesirably lengthy. This raises an expectation for technology which can reduce the test time.

The test time can be reduced if a plurality of word lines can be simultaneously activated during a test mode. Such simultaneous activation can be readily achieved in the following manner.

A row-address decoder is provided inside a DRAM, and decodes a supplied row address to select one word line. Generally, such a row-address decoder receives complement signals as row address signals. That is, if a row address is represented by a set of three bits (A1, A2, A3), the row-address decoder receives signals representing A1, A2, and A3 as well as /A1, /A2, and /A3. NAND circuits are provided inside the row-address decoder for the decoding purposes, and each of the NAND circuits receives a corresponding selection of three bits chosen from A1, A2, A3, /A1, /A2, and /A3. For example, a given NAND circuit receives /A1, A2, and /A3. This NAND circuit outputs a LOW signal only when (A1, A2, A3) is (0, 1, 0). In this manner, each NAND circuit generates an output signal representing a corresponding row address.

When a row-address decoder with complement signals is used, it is relatively easy to activate a plurality of word lines simultaneously. This is achieved by forcing both A3 and /A3 to be HIGH, for example. In this case, two word lines corresponding to row address (1, 1, 0) and (1, 1, 1) are activated at one time. By the same token, forcing A2, /A2, A3, and /A3 to be HIGH results in activation of four word lines.

In this manner, a plurality of word lines can be simultaneously selected if complement signals are supplied to a row-address decoder.

A demand for chip-size reduction, however, requires some DRAM chips to be provided with a row-address decoder receiving only positive-logic signals. Namely, only A1, A2, and A3 are supplied without their complements /A1, /A2, and /A3. In such DRAMs, there is no straightforward method to activate a plurality of word lines at the same time.

As demand for a chip-size reduction becomes stronger, more DRAMs will be provided with a row-address decoder receiving only positive-logic signals. Against this background, we need to seek ways to achieve a simultaneous activation of a plurality of word lines for the purpose of reducing the test time.

Accordingly, there is a need for a semiconductor memory device which can reduce a test time of memory cells.

SUMMARY OF THE INVENTION

Accordingly, it is a general object of the present invention to provide a semiconductor memory device which can achieve the need described above.

It is another and more specific object of the present invention to provide a semiconductor memory device which can reduce a test time of memory cells.

In order to achieve the above objects according to the present invention, a semiconductor memory device capable of conducting test operations includes a plurality of word drivers which keep word lines in an active state when the word drivers are selected until the word drivers are reset, and a control circuit which successively selects more than one of the plurality of word drivers so as to achieve simultaneous activation of word lines corresponding to selected ones of the plurality of word drivers during the test operations.

In the semiconductor memory device described in the above, the plurality of word drivers, when selected, keep word lines in the active state until they are reset, so that successive selection of word drivers can achieve the multiple selection and activation of word lines. Because of this, a time length required for a memory-cell test can be significantly reduced, compared to when only one word line can be activated at one time.

According to one aspect of the present invention, each of the plurality of word drivers includes a latch which can be reset. This latch latches a state which indicates the selection of a corresponding word driver, thereby keeping the active state of the word line.

According to another aspect of the present invention, a signal indicating a row address selects one of the plurality of word drivers, and the state indicative of the selection is latched by a timing pulse.

According to another aspect of the present invention, the multiple-word-line selection is permitted during test operations, but cannot be made during normal operations, which is controlled by a word-line-multiple-selection avoiding circuit. Because of this configuration, only one word line can be activated during the normal operations, while multiple selection of word lines can be achieved during the test operations.

According to another aspect of the present invention, more than one word liens in an active state can be simultaneously deactivated by inputting a precharge command.

According to another aspect of the present invention, redundant-word drivers are operated even during the test operations, so that memory-cell tests can be conducted with respect to redundant memory cells.

According to another aspect of the present invention, a plurality of word lines are successively activated in a multiple manner which enables the plurality of word lines to be simultaneously kept in an active state by drawing on a word-line-multiple-selection function of a semiconductor device. This is done in order to check whether an activated word line has any effect on memory cells of surrounding word lines. Because of the multiple activation of word lines, a time length required for defective-cell tests can be significantly reduced.

According to another aspect of the present invention, data is written in the memory cells of surrounding word lines around word lines, before these word lines are activated in the multiple manner. Then, data is read from the memory cells to check whether data has been changed by the activation of the word lines.

According to another aspect of the present invention, even when there is a limit to a time duration during which the word lines are kept activated, an activation and deactivation of the word lines can be repeated many times, thereby accumulating total time period of word-line activation.

According to another aspect of the present invention, the activation and deactivation of the word lines are repeated for a time duration equivalent to a refresh cycle of memory cells. If no cell defects are detected after the passage of one refresh cycle, it ensures that no malfunction occurs during normal operations. In this manner, the test can be conducted by taking only a necessary and minimum time length.

According to another aspect of the present invention, the activation and deactivation of word lines are performed with respect to a plurality of banks in a bank-interleave manner, so that a further reduction can be achieved with regard to the test time.

According to another aspect of the present invention, multiple activation is also applied to redundant-word lines of redundant cells in addition to the word lines of real cells. Because of this, a test can be conducted in a short time period with regard to not only the real cells but also the redundant cells.

Other objects and further features of the present invention will be apparent from the following detailed description when read in conjunction with the accompanying drawings.

BRIEF DESCRIPTION OF THE DRAWINGS

FIG. 12 is a block diagram showing a portion of a word decoder shown in FIG. 11;

DESCRIPTION OF THE PREFERRED EMBODIMENTS

In the following, embodiments of the present invention will be described with reference to the accompanying drawings.

Figure 1:
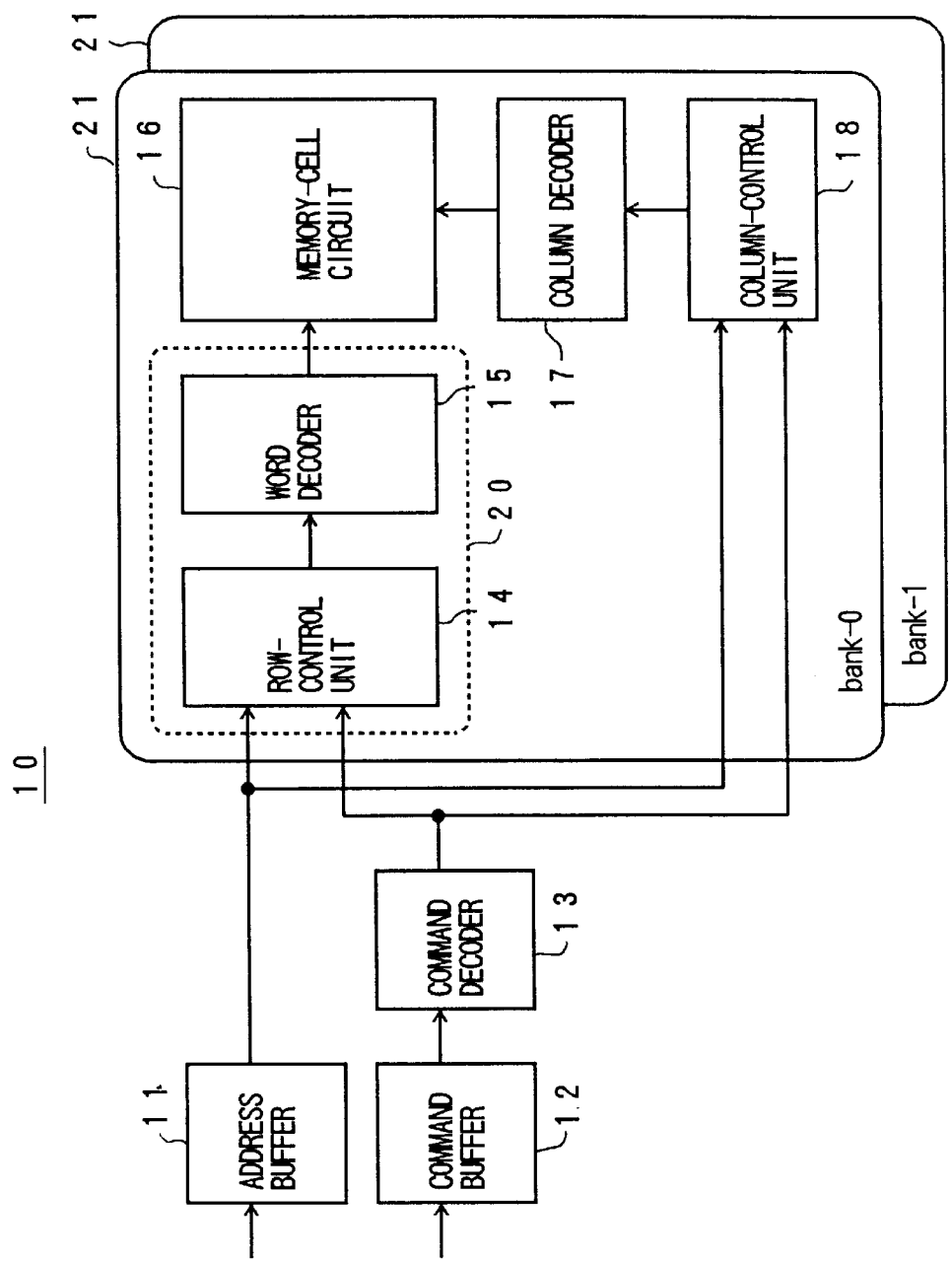
FIG.1 is a block diagram of a DRAM according to the present invention.

FIG. 1 is a block diagram of a DRAM according to the present invention.

A DRAM 10 of FIG.1 includes an address buffer 11, a command buffer 12, a command decoder 13, a row-control control unit 14, a word decoder 15, a memory-cell circuit 16, a column decoder 17, and a column-control unit 18. FIG. 1 shows only signal paths for address signals and command signals for the purpose of explaining word-line control of the present invention, and input/output paths of the data signals are omitted.

In the DRAM 10 of FIG. 1, a word-line-control unit 20 comprised of the row-control unit 14 and the word decoder 15 is different from that of the related art. In the DRAM 10 of the present invention, the word-line-control unit 20 can selectively activate a plurality of word lines at the time of memory-cell test. Details of the word-line-control unit 20 will be described later.

In the DRAM 10 of FIG. 1, address signals input to the address buffer 11 are supplied to the row-control unit 14 for controlling row-address access and to the column-control unit 18 for controlling column-address access. Command signals input to the command buffer 12 are decoded by the command decoder 13, and the contents of the command signals are used for controlling the row-control unit 14 and the column-control unit 18.

The row-control unit 14 controls the word decoder 15 to activate word lines selectively. Based on this operation, memory cells of a selectively activated word line are chosen in the memory-cell circuit 16, and a row-address-access operation is performed with respect to the selected memory cells. The column-control unit 18 controls the column decoder 17 to select a column-selection line. This achieves a column-address access as a column-address is selected in a direction perpendicular to the selected row address. By indicating a row address and a column address in this manner, an access can be made to a memory cell located at an indicated position in a matrix of memory cells, which are contained in the memory-cell circuit 16.

The row-control unit 14, the word decoder 15, the memory-cell circuit 16, the column decoder 17, and the column-control unit 18 are provided for each of the plurality of banks 21. In conventional DRAMs, a row-control unit of each bank is provided with only one row-address latch for latching a single row address, so that only one word line can be selected in each bank.

In the present invention, the word decoder 15 has a latch with respect to each word line in order to indicate whether a given word line is selected, and can selectively activate a plurality of word lines at the time of memory-cell test.

Figure 2:
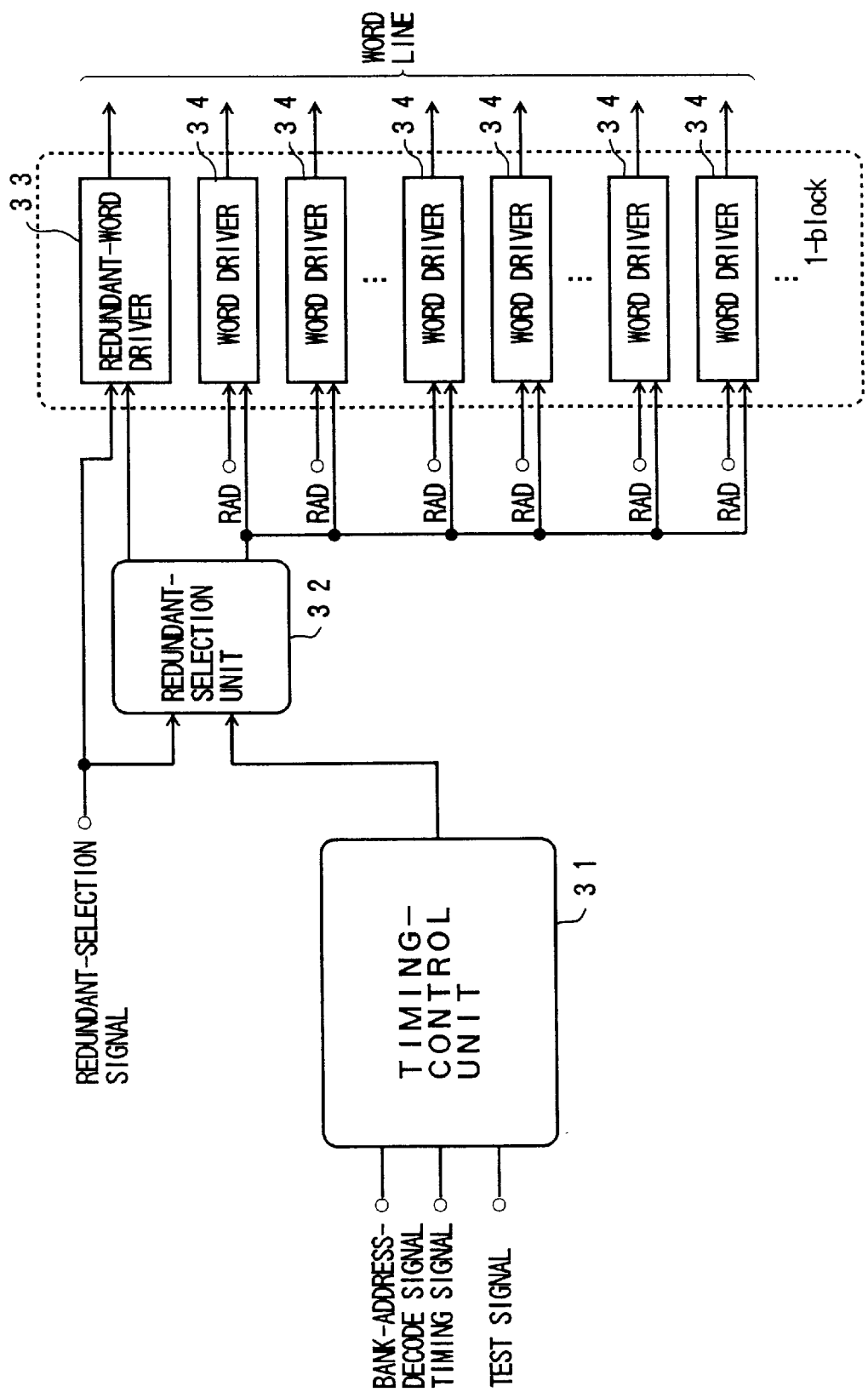
FIG. 2 is a block diagram showing a portion of a word-line-control unit of FIG. 1.

FIG. 2 is a block diagram showing a portion of the word-line-control unit 20 of FIG. 1. The word-line-control unit 20 of FIG. 1 has the same configuration as a conventional word-line-control unit, except for the portion shown in FIG. 2. FIG. 2 shows only a portion relevant to the present invention.

The word-line-control unit 20 of FIG. 2 includes a timing-control unit 31, a redundant-selection unit 32, a redundant-word driver 33, and a plurality of word drivers 34.

The timing-control unit 31 receives a bank-address-decode signal, a timing signal, and a test signal. These signals are the same as those used in the related art. The bank-address-decode signal becomes HIGH when a pertinent bank is selected. The test signal changes to HIGH as an indication of a memory-cell test when a test command is input to the DRAM 10 of FIG. 1. The timing signal indicates a timing to activate a word line. The timing-control unit 31 sends to the redundant-selection unit 32 the timing signal indicating a timing to activate a word line when a pertinent bank is selected.

The redundant-selection unit 32 supplies a timing pulse from the timing-control unit 31 to the redundant-word driver 33 when a redundant-selection signal is HIGH. When the redundant-selection signal is LOW, on the other hand, the redundant-selection unit 32 supplies the timing pulse from the timing-control unit 31 to the word drivers 34. The redundant-word driver 33 is used for accessing an alternate memory cell (redundant memory cell) functioning in place of a defective memory cell. When an access is attempted with respect to a defective memory cell, the redundant-selection unit 32 switches an access destination from the defective memory cell to a redundant memory cell of the redundant-word driver 33. This switching is made by using the redundant-selection signal, which is the same as that of the related art.

Each of the redundant-word driver 33 and the word drivers 34 is equipped with a 1-bit latch, and keeps an output thereof serving as a word line in an active state once a given row address is selected. The word line is kept in the active state until it is reset. The redundant-word driver 33 activates a word line when a timing pulse is provided while the redundant-selection signal is HIGH. The word drivers 34 activates a word line when a timing pulse is provided while a row-address-decode signal RAD is HIGH. The row-address-decode signal RAD indicates a decoded row address, and becomes HIGH only with respect to a selected row address.

Figure 3:
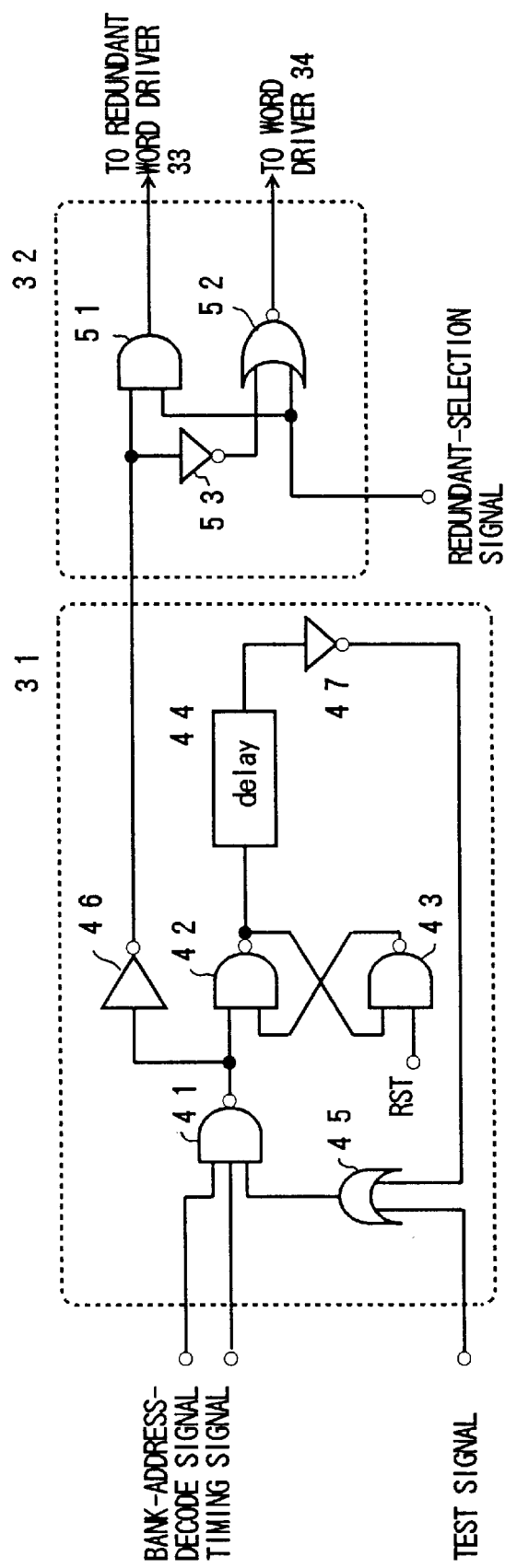
FIG. 3 is a circuit diagram of a timing-control unit and a redundant-selection unit.

FIG. 3 is a circuit diagram of the timing-control unit 31 and the redundant-selection unit 32.

The timing-control unit 31 includes NAND circuits 41 through 43, a delay element 44, an OR circuit 45, and inverters 46 and 47. When a HIGH pulse of a timing signal arrives while the bank-address-decode signal and the test signal are HIGH, an output of the NAND circuit 41 becomes LOW. A HIGH pulse is thus supplied to the redundant-selection unit 32 via the inverter 46.

A reset signal RST is normally HIGH. When an output of the NAND circuit 41 is changed to LOW, a latch comprised of the NAND circuits 42 and 43 latches a HIGH output. The HIGH-output signal from the latch is delayed by the delay element 44, and is supplied as a LOW signal via the inverter 47 to the OR circuit 45. Accordingly, when the test signal is at a LOW level indicating a normal operation rather than a memory-cell-test operation, the output of the OR circuit 45 is changed to and kept at a LOW level once a HIGH pulse of the timing signal is supplied. A next and following pulses of the timing signal do not pass through the NAND circuit 41 in this case. This can prevent more than one word line from being selected simultaneously during the normal operation. That is, a multiple selection of the word lines can be avoided.

When the reset signal RST is changed to LOW during the normal operation, the latch comprised of the NAND circuits 42 and 43 latches a LOW output. When this happens, a signal supplied from the inverter 47 to the OR circuit 45 is changed to HIGH, and thereby the NAND circuit 41 allows a next HIGH pulse of the timing signal to pass therethrough.

At the time of test, the test signal is HIGH, so that the feedback loop for avoiding the multiple word-line selection is invalidated in terms of its intended function. In this case, therefore, the NAND circuit 41 allows all HIGH pulses of the timing signal to pass therethrough.

The redundant-selection unit 32 includes an AND circuit 51, a NOR circuit 52, and an inverter 53. When the redundant-selection signal is HIGH, an output of the NOR circuit 52 is kept at a LOW level at all times, and the AND circuit 51 allows passage of a HIGH pulse from the timing-control unit 31 to supply this HIGH pulse as an output thereof. When the redundant-selection signal is LOW, on the other hand, the output of the AND circuit 51 is maintained at a LOW level all the time, and the output of the NOR circuit 52 is the HIGH pulse supplied from the timing-control unit 31. The output of the AND circuit 51 is provided to the redundant-word driver 33, and the output of the NOR circuit 52 is supplied to the word drivers 34.

Figure 4:
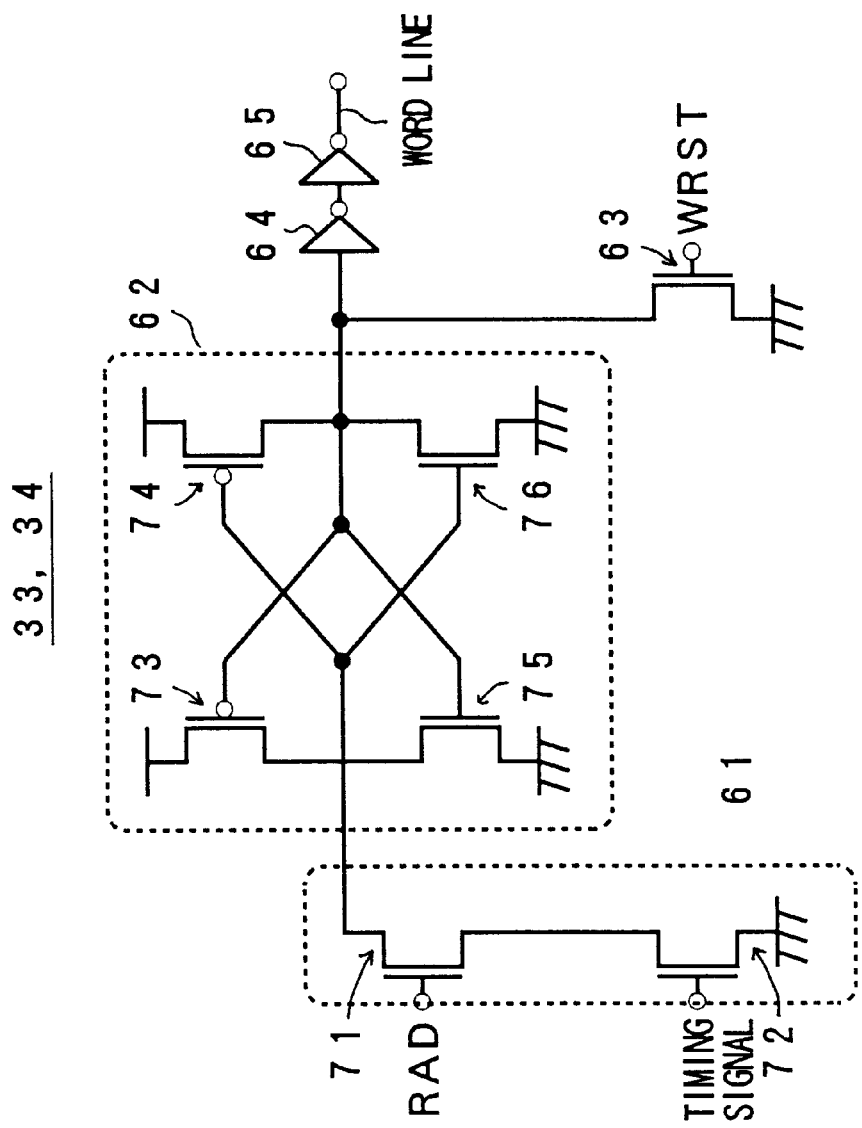
FIG. 4 is a circuit diagram showing one of a redundant-word driver and a word drivers.
Figure 5:
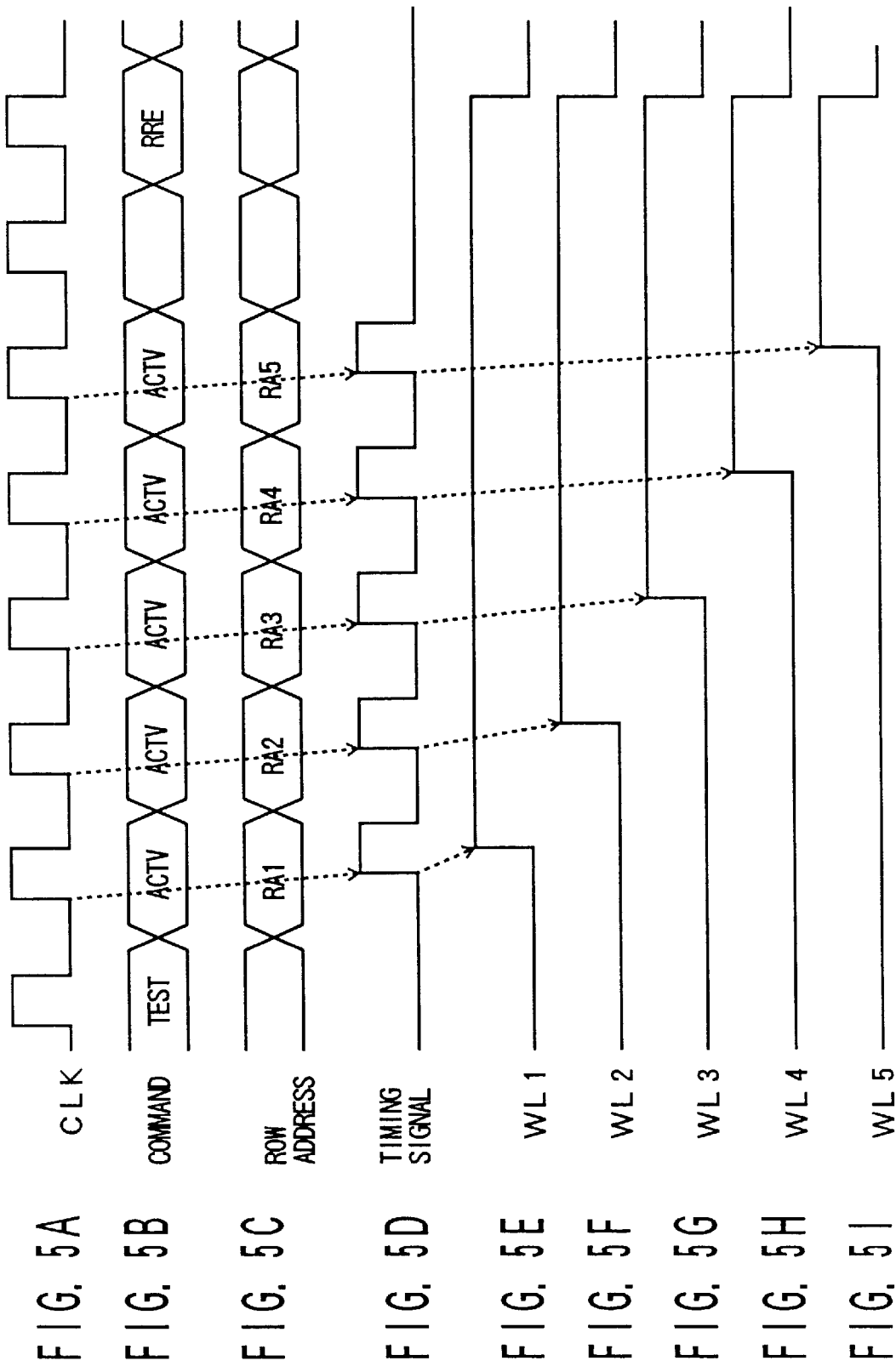
FIGS. 5A through 5I are timing charts showing operations regarding simultaneous activation of a plurality of word lines.

FIG. 4 is a circuit diagram showing one of the redundant-word driver 33 and the word drivers 34. The word driver 34 (or the redundant-word driver 33) of FIG. 4 includes a decoding unit 61, a latch 62, a NMOS transistor 63 for resetting the driver, and inverters 64 and 65. The decoding unit 61 changes an input to the latch 62 to LOW when both the row-address-decode signal RAD and the timing signal become HIGH. Upon receiving the LOW input, the latch 62 latches a HIGH output. The HIGH output of the latch 62 is supplied to a word line via the inverters 64 and 65.

The decoding unit 61 includes NMOS transistors 71 and 72. The latch 62 includes PMOS transistors 73 and 74 and NMOS transistors 75 and 76. The above described operations are performed by these transistors.

The word driver shown in FIG. 4 keeps outputting a HIGH-level voltage to the word line once the word driver is selected until the word driver is reset by a reset signal WRST. This makes it possible to activate a plurality of word lines at the same time during a time of memory-cell test. The reset signal WRST may be a signal which becomes HIGH in synchronism with the precharge operation.

FIGS. 5A through 5I are timing charts showing operations regarding simultaneous activation of a plurality of word lines.

After inputting a test command TEST to the DRAM 10 of FIG. 1, a plurality of activation commands ACTV are successively input in order to activate word lines. Each time an activation command ACTV is input, a HIGH pulse of the timing signal is supplied to the timing-control unit 31 of FIG. 2 in synchronism with the clock signal CLK. Further, row addresses RA1 through RA5 are input in synchronism with the activation commands ACTV.

The HIGH pulses supplied to the timing-control unit 31 are then supplied to the redundant-word driver 33 or the word drivers 34. As a result, five word drivers corresponding to the row addresses RA1 through RA5 are successively selected, thereby changing corresponding word lines WL1 through WL5 to HIGH in sequence. The word lines WL1 through WL5 which are now at a HIGH level are then reset through a precharge command PRE.

In this manner, a plurality of word lines can be simultaneously activated at a time of the test operation.

Figure 6:
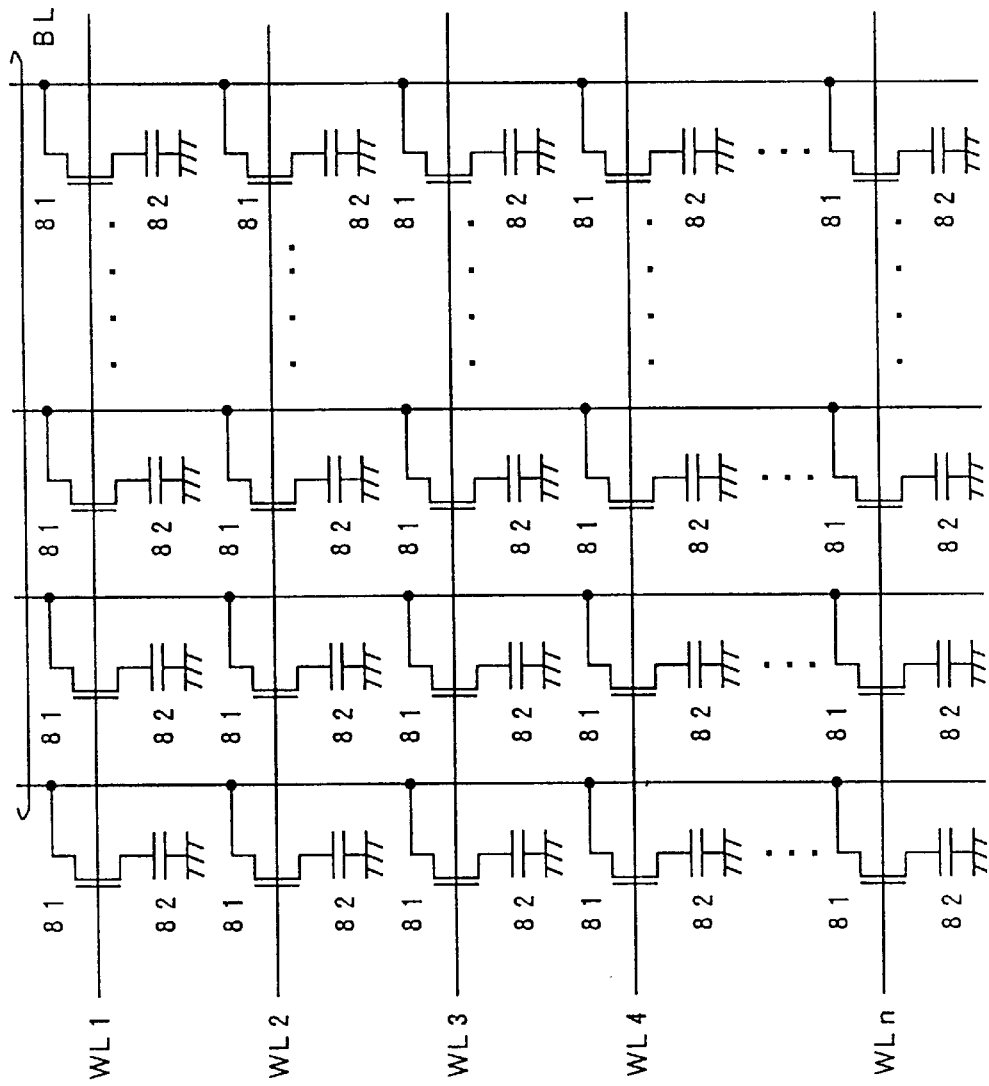
FIG. 6 is an illustrative drawing for explaining a disturb test when a plurality of word lines are simultaneously activated.

FIG. 6 is an illustrative drawing for explaining a disturb test when a plurality of word lines are simultaneously activated.

FIG. 6 shows a configuration of word lines and relevant elements inside the memory-cell circuit 16 of FIG. 1. As shown in FIG. 6, each of word lines WL1 through WLn is connected to a gate of cell-gate transistors 81. When one of the word lines WL1 through WLn is selectively activated, the cell-gate transistors 81 connected the selected word line are turned on. As the cell-gate transistors 81 are turned on, data stored in memory cells 82 are read to the bit lines BL. An order of these operations is reversed when data is written.

In the present invention, a disturb test can be performed with respect to a plurality of word lines at a time of memory-cell test. Word lines selected at intervals of a predetermined number of intervening word lines can be subjected to the test. For the sake of explanation, it is assumed that every other word line is tested. In this case, the word line WL2, for example, is selectively activated among the word lines WL1 through WLn by using the word drivers 34 of FIG. 2. Data is then supplied to the bit lines BL, and is written in a corresponding one of the memory cells 82 with respect to the activated word line. After completion of the data-write operation, the word line WL2 is deactivated. A series of operations of activation and deactivation is carried out with respect to even-number word lines WL2, WL4, and so on in sequence.

Then, odd-number word lines WL1, WL3, and so on are simultaneously activated, and operations of activation and deactivation are repeated many times. After these operations, the odd-number word lines WL2, WL4, and so forth are activated and deactivated one after another to read data stored in the memory cells 82 of these word lines. A check is then made as to whether the initially written data is correctly read. In this manner, a disturb test can be conducted to a plurality of word lines in a simultaneous manner.

In the present invention, activation of each word line is not concurrent in terms of a rising-edge timing when a plurality of word lines are activated. As shown in FIGS. 5E through 5I, each word line is raised one after another. In order to achieve simultaneous activation of m word lines, therefore, m clock cycles are needed if word lines are raised once in one clock cycle. If only one word line can be activated at one time as in the related art, however, activation of a given word line has to wait more than one cycle after a previous word line is activated. A multiple word selection as in the present invention thus can shorten the test time significantly.

Figure 7:
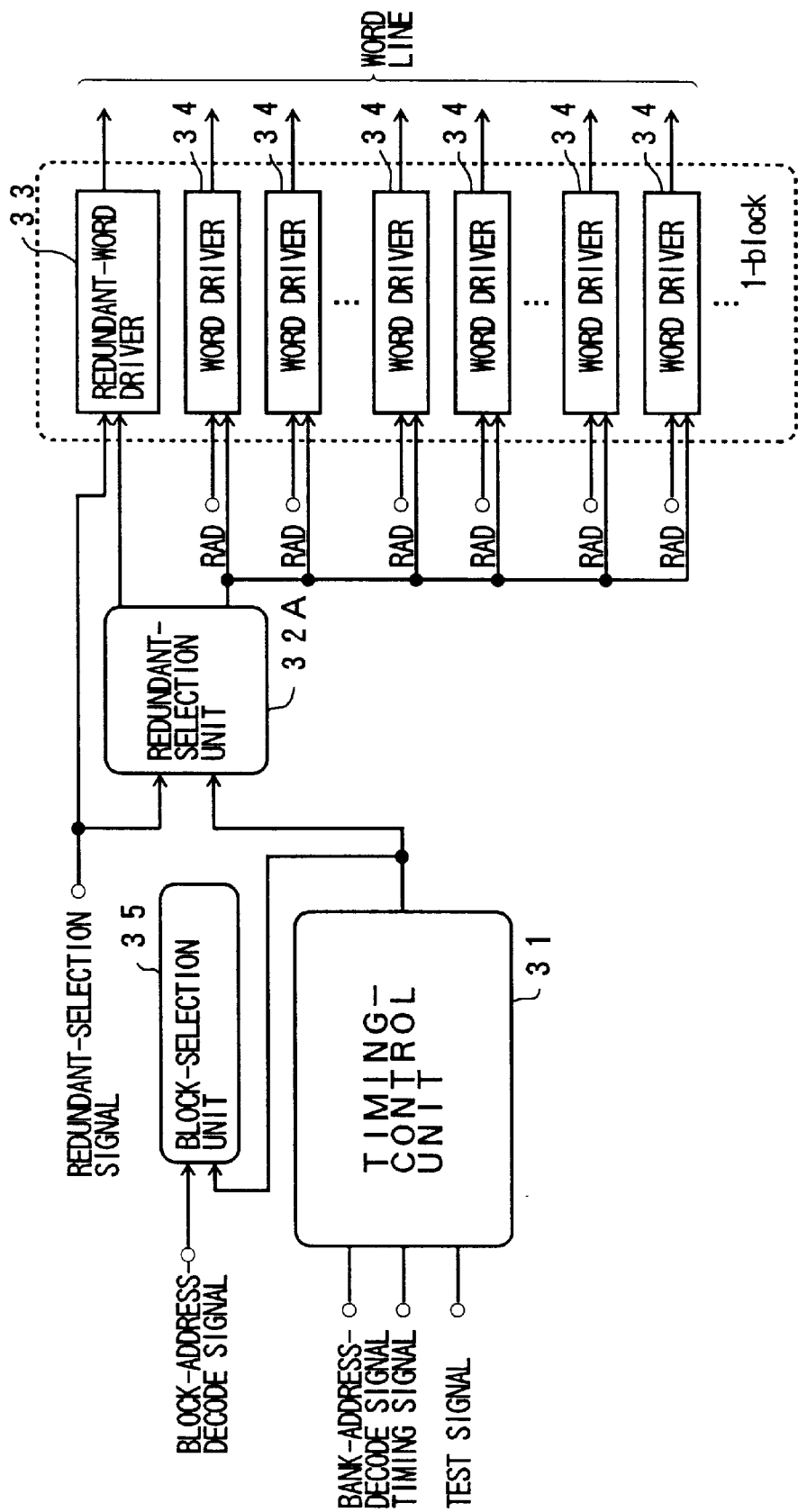
FIG. 7 is a block diagram showing a portion of a word-line-control unit when row addresses are divided into a plurality of blocks in each of the banks of the DRAM, and a word-line selection is controlled with respect to each block.

FIG. 7 is a block diagram showing a portion of the word-line-control unit 20 when row addresses are divided into a plurality of blocks in each of the banks 21 of the DRAM 10, and a word-line selection is controlled with respect to each block. In FIG. 7, the same elements as those of FIG. 2 are referred to by the same numerals, and a description thereof will be omitted.

In FIG. 7, a redundant-selection unit 32A is provided in place of the redundant-selection unit 32 of FIG. 2, and a block-selection unit 35 is additionally provided.

The block-selection unit 35 receives a blockaddress-decode signal which becomes HIGH only when a pertinent block is selected. The block-selection unit 35 further receives the timing pulse from the timing-control unit 31. When the timing pulse is changed to HIGH, the block-selection unit 35 latches the block-address-decode signal. In this manner, the blockselection unit 35 outputs a HIGH signal when the timing pulse becomes HIGH while the pertinent block is selected.

The redundant-selection unit 32A generates an output thereof only when the output from the block-selection unit 35 is HIGH. The redundant-selection unit 32A supplies the timing pulse from the timing-control unit 31 to the redundant-word driver 33 when the redundant-selection signal is HIGH. When the redundant-selection signal is LOW, on the other hand, the redundant-selection unit 32A supplies the timing pulse from the timing-control unit 31 to the word drivers 34. When the output from the block-selection unit 35 is LOW, these outputs from the redundant-selection unit 32A are not generated.

The block-selection unit 35 is a latch circuit having a simple configuration, and the redundant-selection unit 32A is a simple logic circuit which is easy to implement for ordinary skill in the art. Detailed configurations of these units will be omitted.

In the following, a more detailed description will be provided with regard to a test of memory cells.

Semiconductor memory devices such as DRAMs (dynamic random access memory) and SDRAMs (synchronous DRAM) store data in memory cells arranged in a matrix form comprised of rows and columns. With regard to such semiconductor memory devices, there is a need to conduct a test at a site of manufactures to check memory-cell functions, so that defective memory cells exhibiting malfunction can be removed or defective semiconductor memory devices can be rejected according to test results. In general, in order to conduct a test for memory-cell functions, data is written in memory cells, and, then, data is read from the same memory cells to check whether the stored data and the retrieved data are the same.

Defective cells exhibit several different types of malfunction. A certain type of a defective cell does not show malfunction when write/read operations are performed with respect to this cell itself, but induces malfunction in surrounding non-defective cells when a word line corresponding to this defective cell is kept in an active state for a long time. In the case of this induced malfunction, data stored in the surrounding non-defective cells is inverted.

Figure 8:
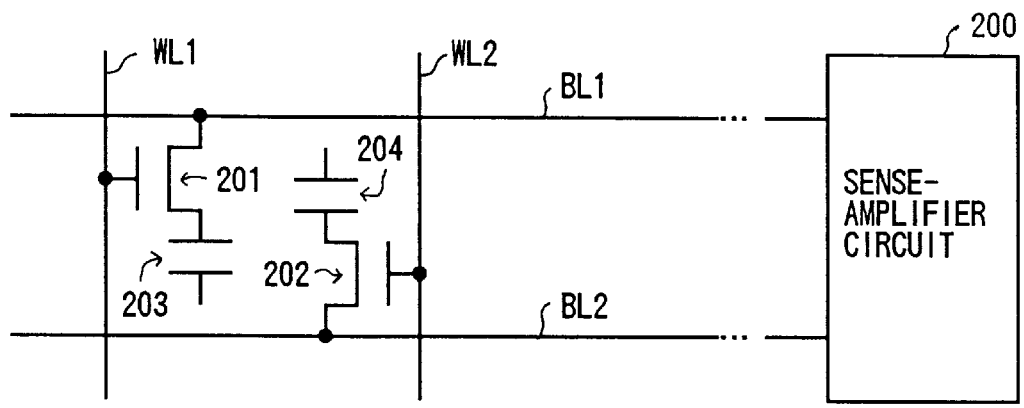
FIG. 8 is an illustrative drawing for explaining malfunction of a certain type of defective cell.

FIG. 8 is an illustrative drawing for explaining malfunction of a defective cell of the above-described type.

In order to write data "1" in a cell 303 comprised of a capacitor, a word line WL1 is selectively activated to be changed to HIGH, so that data "1" in a sense-amplifier circuit 300 is stored in the cell 303 via a bit line BL1 and a transistor 301. While the data "1" is kept in storage in the cell 303, a word line WL2 is selectively activated and changed to HIGH. Then, data "0", for example, is written in a cell 304 via a bit line BL2 and a transistor 302. In order to read data from the cell 304, the word line WL2 is selectively activated, and the data is transferred to the sense-amplifier circuit 300 via the transistor 302 and the bit line BL2.

When the word line WL2 is activated for a long time by repeating activation and deactivation of the word line WL2 for the purpose of writing/reading data with respect to the cell 304 as described above, the data of the cell 303 may be changed to "0" despite of the initially stored value of "1". This is believed to be caused by a pin-hole defect of the cell 304.

Figure 9:
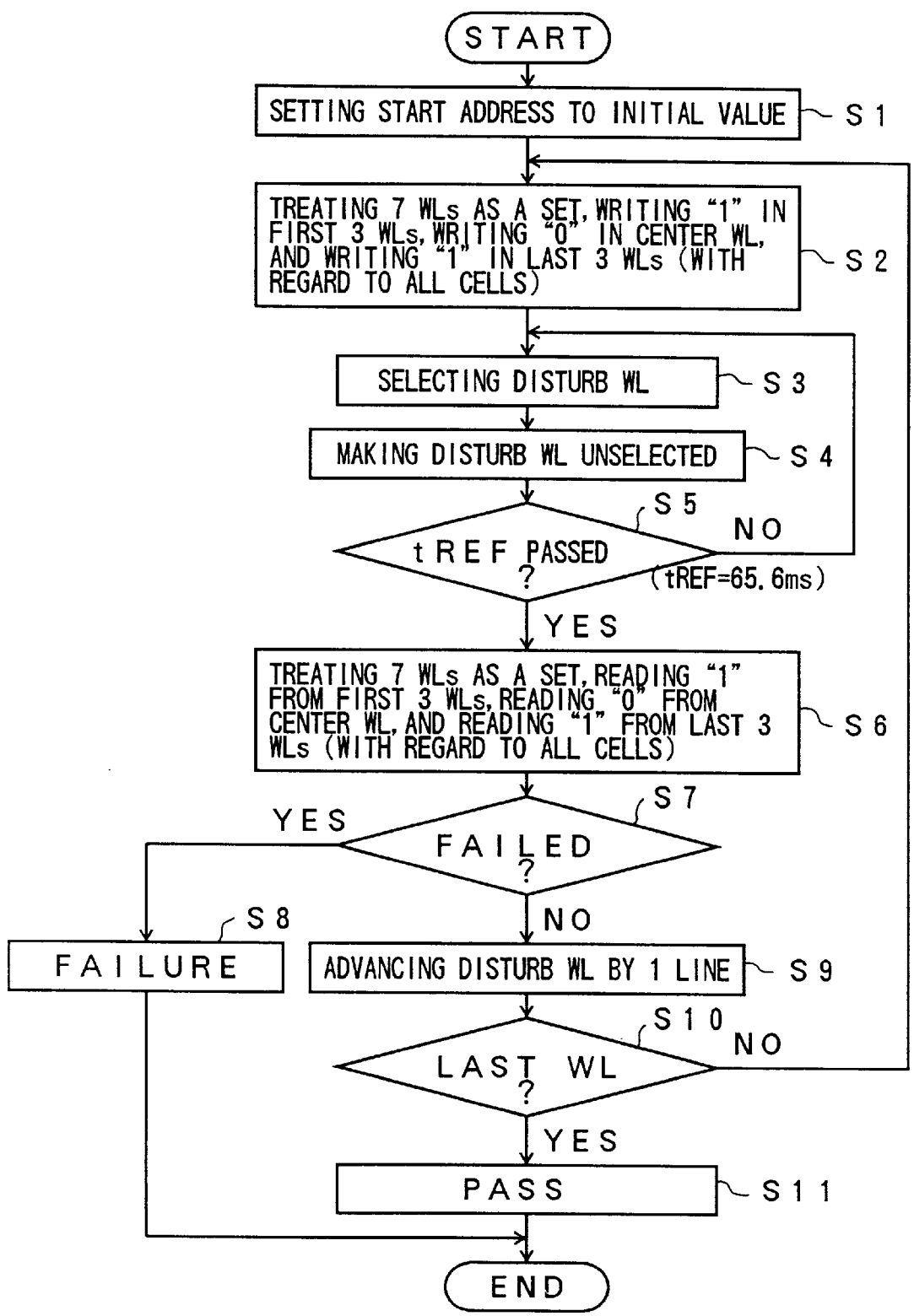
FIG. 9 is a flowchart of a related-art method of testing defective cells in a semiconductor memory device.

FIG. 9 is a flowchart of a related-art method of testing defective cells in a semiconductor memory device.

At a step S1, an address to be subjected to a test is set to an initial address.

At a step S2, seven word lines are selected and grouped as a set such that these seven word lines center around a word line corresponding to an indicated address. Data "1" is written in all the memory cells with respect to the three word lines provided on one side of the center word line, and is written in all the memory cells with respect to the three word lines provided on the other side of the center word line, with all the memory cells of the center word line having data "0" written therein. This center word line is referred to as a disturb WL in FIG. 9.

At a step S3, the center word line is selectively activated.

At a step S4, the center word line is deactivated.

At a step S5, a check is made whether a time period tREF has passed. Here, the time period tREF is an interval of refresh operations conducted with respect to memory cells, and is 65.6 ms, for example. The reason why a passage of the time period tREF is checked is as follows. If no data change takes place even after the refresh time period tREF passes, there is no need to check operations of the semiconductor memory device for a longer time period since it can be ascertained that no errors should occur in actual operations. Further, the reason why activation and deactivation of the center word line are repeated many times at the steps S3 and S4 is that a time length during which the word line can be kept active is limited in practice. If a word line could be continuously kept in an active state for a sufficiently long time period, there would be no need to activate and deactivate it repeatedly.

At a step S6, all the cells of the seven word lines are read.

At a step S7, a check is made whether the read data are equal to the written data. If not, the procedure goes to a step S8, where the product is rejected since cells causing a data mismatch should be defective cells. If all the read data are equal to the written data, the procedure goes to a step S9.

At a step S9, an address is incremented by one, so that the center word line to be activated is shifted by one line.

At a step S10, a check is made whether the test is completed up to the last word line. If the answer is YES, the product is accepted as a good product at a step S11. If the answer is NO, the procedure goes back to a step S2 to repeat the above-described steps.

In the related-art method of FIG. 9, at least 65.6 ms is necessary for conducting a memory-cell test with respect to each word line. If a 256-Mbit SDRAM having 8192 word lines in one bank and having four banks in total is subjected to a test, a time length required for the test is 35 minutes 49 seconds (4×8192×65.6 ms).

A time period required for the step S2 or S6 of FIG. 9 is 179.2 μs (100 [ns]×256×7) when each word line is provided with 256 cells and a read/write operation takes 100 ns for each cell. In comparison with the refresh time period tREF (65.6 ms), the time period required for the step S2 or S6 is minimal.

In this manner, a related-art method requires a lengthy time period for checking whether surrounding cells are affected when a center word line is activated, thereby leading to an undesirably long test time.

Accordingly, there is a need for a test method which can detect defective cells of a semiconductor memory device in a short time.

Figure 10:
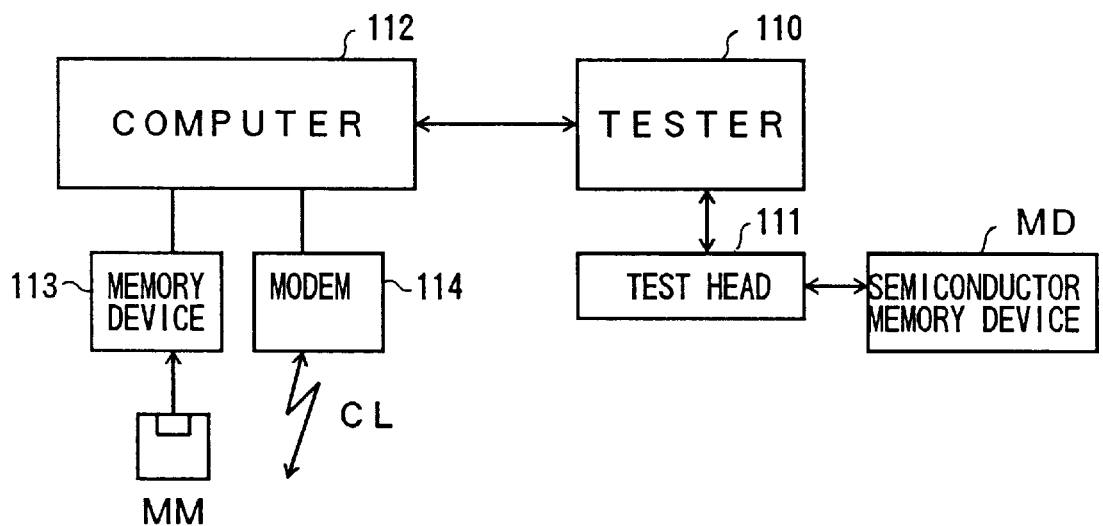
FIG. 10 is a block diagram of a system used for performing a method of detecting defective cells according to the present invention.

FIG. 10 is a block diagram of a system used for performing a method of detecting defective cells according to the present invention.

The system of FIG. 10 includes a tester 110, a test head 111, a computer 112, a memory device 113, and a modem 114. The tester 110 is a processing device including a processor, ROM, RAM, etc., and performs a test for a semiconductor memory device MD attached to the test head 111. The test head 111 has input/output nodes for connection. Operations of the tester 110 are controlled by the computer 112 such as a personal computer, a work station, or the like.

The computer 112 receives a program of a defective-cell-detection-test method from the memory device 113 or the modem 114. That is, the memory device 113 reads the program of a defective-cell-detection-test method from a memory medium MM such as a floppy disk, a CD-ROM, etc., and supply the program to the computer 112. The modem 114 accesses a remote-site storage medium storing the program of a defective-cell-detection-test method via a communication line CL, and supply the program to the computer 112.

Based on the program of a defective-cell-detection-test method, the computer 112 and the tester 110 check whether the semiconductor memory device MD has defective cells exhibiting malfunction. A configuration of the system of FIG. 10 is within the scope of the prior art, and a description thereof will be omitted. In the method of a defective-cell-detection test according to the present invention, however, it should be noted that the semiconductor memory device MD subjected to the test is equipped with a function to achieve a simultaneous activation of a plurality of word lines.

Figure 11:
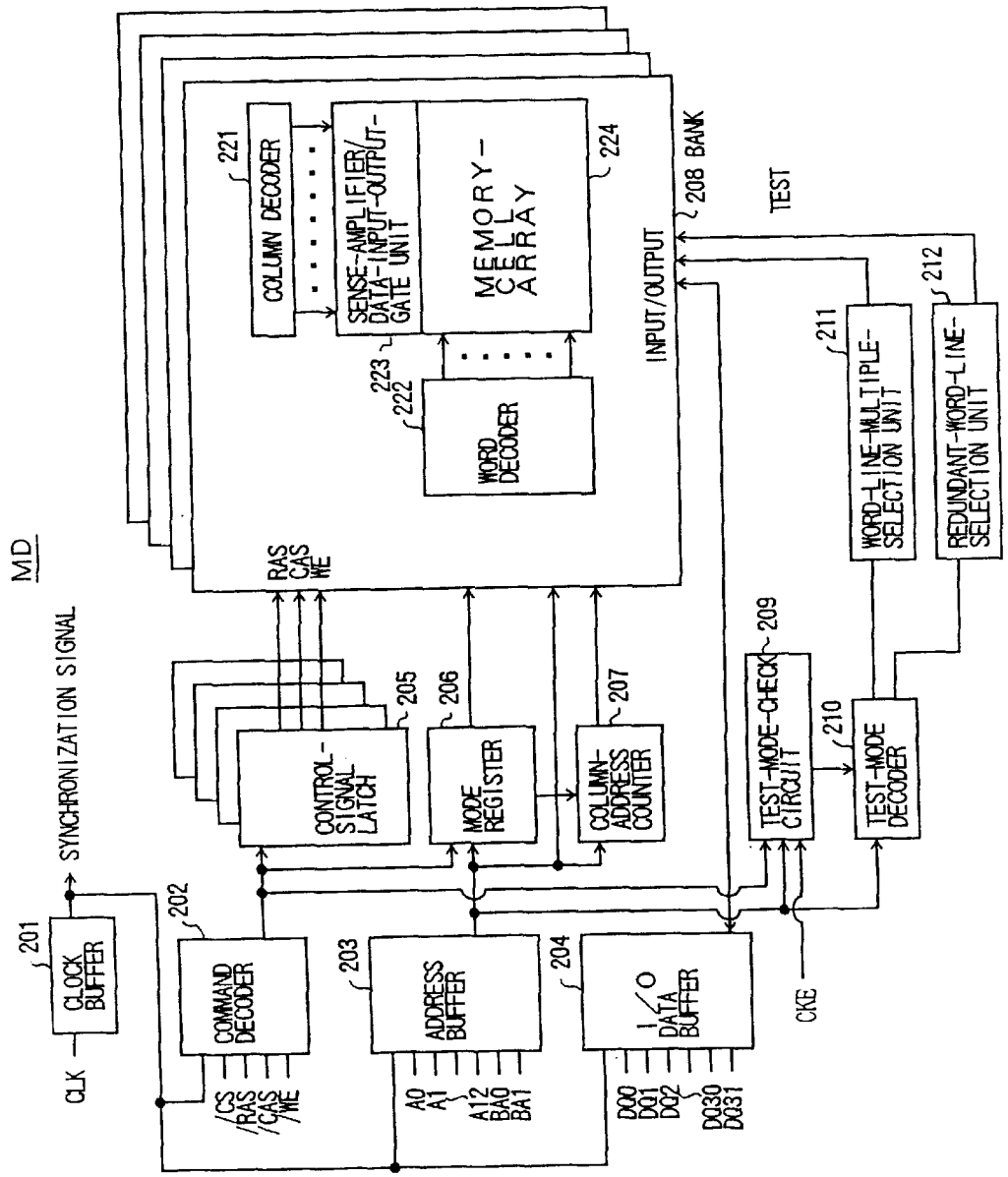
FIG. 11 is a block diagram of a semiconductor memory device MD.

FIG. 11 is a block diagram of the semiconductor memory device MD.

A semiconductor memory device MD of FIG.11 includes a clock buffer 201, a command decoder 202, an address buffer 203, an I/O-data buffer 204, a control-signal latch 205, a mode register 206, a column-address counter 207, a plurality of banks 208, a test-mode-check circuit 209, a test-mode decoder 210, a word-line-multiple-selection unit 211, and a redundant-word-line-selection unit 212. A bank 208 includes a column decoder 221, a word decoder 222, a sense-amplifier/data-input-output-gate unit 223, and a memory-cell array 224.

The clock buffer 201 receives a clock signal CLK, and supplies it as a synchronization signal to the command decoder 202, the address buffer 203, and the I/O-data buffer 204. The clock buffer 201 also supplies synchronization signals for operation control to internal circuits of the semiconductor memory device MD.

The command decoder 202 receives control signals /CS (chip select), /RAS (row address strobe), /CAS (column address strobe), and /WE (write enable), and decodes these control signals. The command decoder 202 supplies a decoding result to the control-signal latch 205 and the mode register 206. The control-signal latch 205 latches the decoding result provided from the command decoder 202, so that the banks 208 are controlled based on the latched decoding results.

The address buffer 203 receives address signals AO-A12, BA0, and BA1, and supplies these address signals to the mode register 206, the column-address counter 107, and the banks 208. As shown in FIG. 11, four banks 208, for example, may be provided, and one of the banks 208 is selected based on the bank address BAO and BA1.

The mode register 206 stores parameters for indicating CAS latency, a burst length, etc. An instruction to write parameters is given to the mode register 206 by a control signal, and the contents of parameters are specified by address signals.

The column-address counter 207 successively generates consecutive column addresses when successive column addresses are to be accessed at the same row address, and supplies the generated column addresses to the banks 208.

In one of the banks 208, the word decoder 222 reads data from memory cells of the memory-cell array 224 which are indicated by the supplied row address, and the data is stored in sense amplifiers of the sense-amplifier/data-input-output-gate unit 223. The column decoder 221 opens data-input-output gates of the sense-amplifier/data-input-output-gate unit 223, and supplies data of a sense amplifier corresponding to the supplied column address to the I/O-data buffer 204. When data is written, operations which are reverse to the above described operations are carried out.

The I/O-data buffer 204 is a buffer used for inputting and outputting data signals DQ0 through DQ31.

The test-mode-check circuit 209 receives the decoding result from the command decoder 202, the address signals from the address buffer 103, and a signal /CKE, and determines whether an operation mode is the test operation mode or the normal operation mode. In detail, the operation mode is the test operation mode when all the control signals /RAS, /CAS, /WE, and /CS are LOW, and the signal /CKE is at a super high level, which is a voltage higher than the power voltage VCC.

The test-mode decoder 210 decodes the address signals from the address buffer 203 when the test-mode-check circuit 209 finds that the operation mode is the test operation mode. A bit pattern of the address signals determines what kind of test is conducted. The test-mode decoder 210 supplies the decoding results as control signals to test units such as the word-line-multiple-selection unit 211 and the redundant-word-line-selection unit 212. In this manner, the type of the test can be specified by the address signals, and the word-line-multiple-selection unit 211 is used, for example, to control a test operation based on a multiple word-line selection. The word-line-multiple-selection unit 211 outputs a test signal TEST (i.e., activates the test signal TEST) when the word-line-multiple selection test is indicated. The test signal TEST enables a multiple word-line selection to be made.

In conventional DRAMs, the word decoder 222 of each bank 108 is provided with only one row-address latch for latching a single row address, so that only one word line can be selected in each bank 108.

In the present invention, the word decoder 222 has a latch with respect to each word line in order to indicate whether a given word line is selected, and can selectively activate a plurality of word lines at the time of memory-cell test.

FIG. 12 is a block diagram showing a portion of the word decoder 222 shown in FIG. 11. The word decoder 222 of FIG. 11 has the same configuration as that of the prior art, except for the portion thereof shown in FIG. 12. The same configuration as that of the prior art, for example, is used in an address decoding portion. FIG. 12 shows only a portion relevant to the present invention.

The relevant portion of the word decoder 222 shown in FIG. 12 includes a timing-control unit 131, a redundant-selection unit 132, a redundant-word driver 133, and a plurality of word drivers 134.

The timing-control unit 131 receives a bank-address-decode signal, a timing signal, and a test signal TEST. The bank-address-decode signal and the timing signal are the same as those used in the related art. The bank-address-decode signal becomes HIGH when a pertinent bank is selected. The test signal TEST changes to HIGH as an indication of a memory-cell test when a word-line-multiple-selection test is indicated. The timing signal indicates a timing to activate a word line. The timing-control unit 131 sends to the redundant-selection unit 132 the timing signal indicating a timing to activate a word line when a pertinent bank is selected.

The redundant-selection unit 132 supplies a timing pulse from the timing-control unit 131 to the redundant-word driver 133 when a redundant-selection signal is HIGH. When the redundant-selection signal is LOW, on the other hand, the redundant-selection unit 132 supplies the timing pulse from the timing-control unit 131 to the word drivers 134. The redundant-word driver 133 is used for accessing an alternate memory cell (redundant memory cell) functioning in place of a defective memory cell. When an access is attempted with respect to a defective memory cell, the redundant-selection unit 132 switches an access destination from the defective memory cell to a redundant memory cell of the redundant-word driver 133. This switching is made by using the redundant-selection signal, which is the same as that of the related art.

Each of the redundant-word driver 133 and the word drivers 134 is equipped with a 1-bit latch, and keeps an output thereof serving as a word line in an active state once a given row address is selected. The word line is kept in the active state until it is reset. The redundant-word driver 133 activates a word line when a timing pulse is provided while the redundant-selection signal is HIGH. The word drivers 134 activates a word line when a timing pulse is provided while a row-address-decode signal RAD is HIGH. The row-address-decode signal RAD indicates a decoded row address, and becomes HIGH only with respect to a selected row address.

Figure 13:
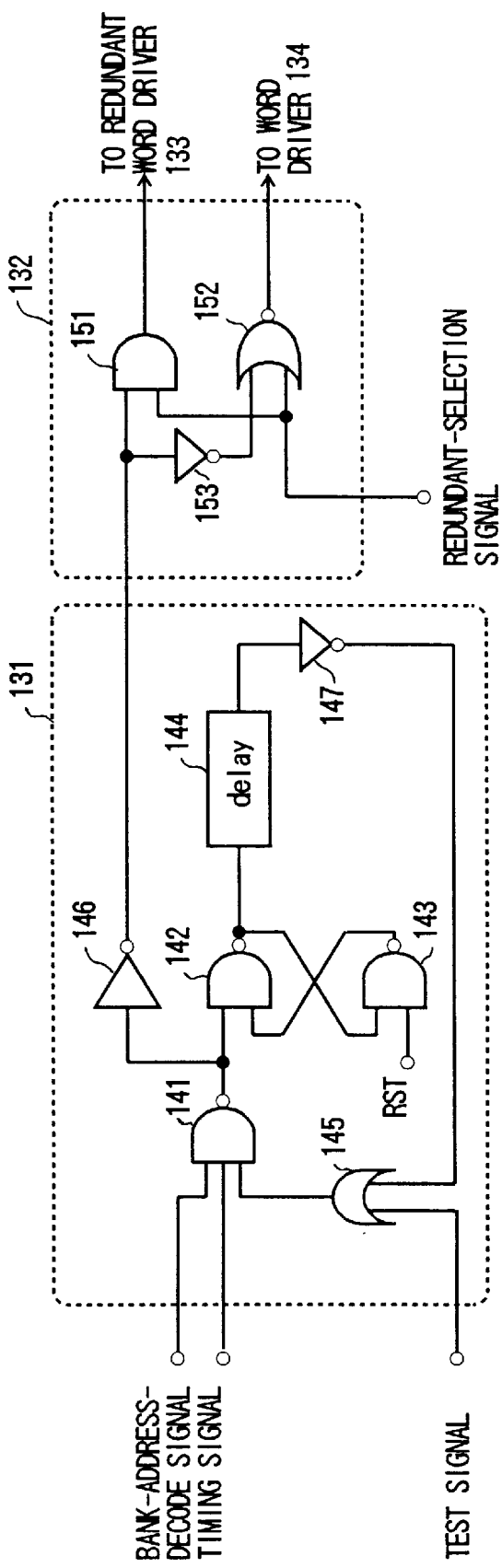
FIG. 13 is a circuit diagram of a timing-control unit and a redundant-selection unit.

FIG. 13 is a circuit diagram of the timing-control unit 131 and the redundant-selection unit 132.

The timing-control unit 131 includes NAND circuits 141 through 143, a delay element 144, an OR circuit 145, and inverters 146 and 147. When a HIGH pulse of a timing signal arrives while the bank-address-decode signal and the test signal are HIGH, an output of the NAND circuit 141 becomes LOW. A HIGH pulse is thus supplied to the redundant-selection unit 132 via the inverter 146.

A reset signal RST is normally HIGH. When an output of the NAND circuit 141 is changed to LOW, a latch comprised of the NAND circuits 142 and 143 latches a HIGH output. The HIGH-output signal from the latch is delayed by the delay element 144, and is supplied as a LOW signal via the inverter 147 to the OR circuit 145. Accordingly, when the test signal is at a LOW level indicating a normal operation rather than a memory-cell-test operation, the output of the OR circuit 145 is changed to and kept at a LOW level once a HIGH pulse of the timing signal is supplied. A next and following pulses of the timing signal do not pass through the NAND circuit 141 in this case. This can prevent more than one word line from being selected simultaneously during the normal operation. That is, a multiple selection of the word lines can be avoided.

When the reset signal RST is changed to LOW during the normal operation, the latch comprised of the NAND circuits 142 and 143 latches a LOW output. When this happens, a signal supplied from the inverter 147 to the OR circuit 145 is changed to HIGH, and thereby the NAND circuit 141 allows a next HIGH pulse of the timing signal to pass therethrough. The reset signal RST becomes LOW when a precharge command is input to the semiconductor memory device MD, and indicates a start of reset operations including a precharge operation after a row access is completed.

At the time of test, the test signal TEST is HIGH, so that the feedback loop for avoiding the multiple word-line selection is invalidated in terms of its intended function. In this case, therefore, the NAND circuit 141 allows all HIGH pulses of the timing signal to pass therethrough.

The redundant-selection unit 132 includes an AND circuit 151, a NOR circuit 152, and an inverter 153. When the redundant-selection signal is HIGH, an output of the NOR circuit 152 is kept at a LOW level at all times, and the AND circuit 151 allows passage of a HIGH pulse from the timing-control unit 131 to supply this HIGH pulse as an output thereof. When the redundant-selection signal is LOW, on the other hand, the output of the AND circuit 151 is maintained at a LOW level all the time, and the output of the NOR circuit 152 is the HIGH pulse supplied from the timing-control unit 131. The output of the AND circuit 151 is provided to the redundant-word driver 133, and the output of the NOR circuit 152 is supplied to the word drivers 134.

Figure 14:
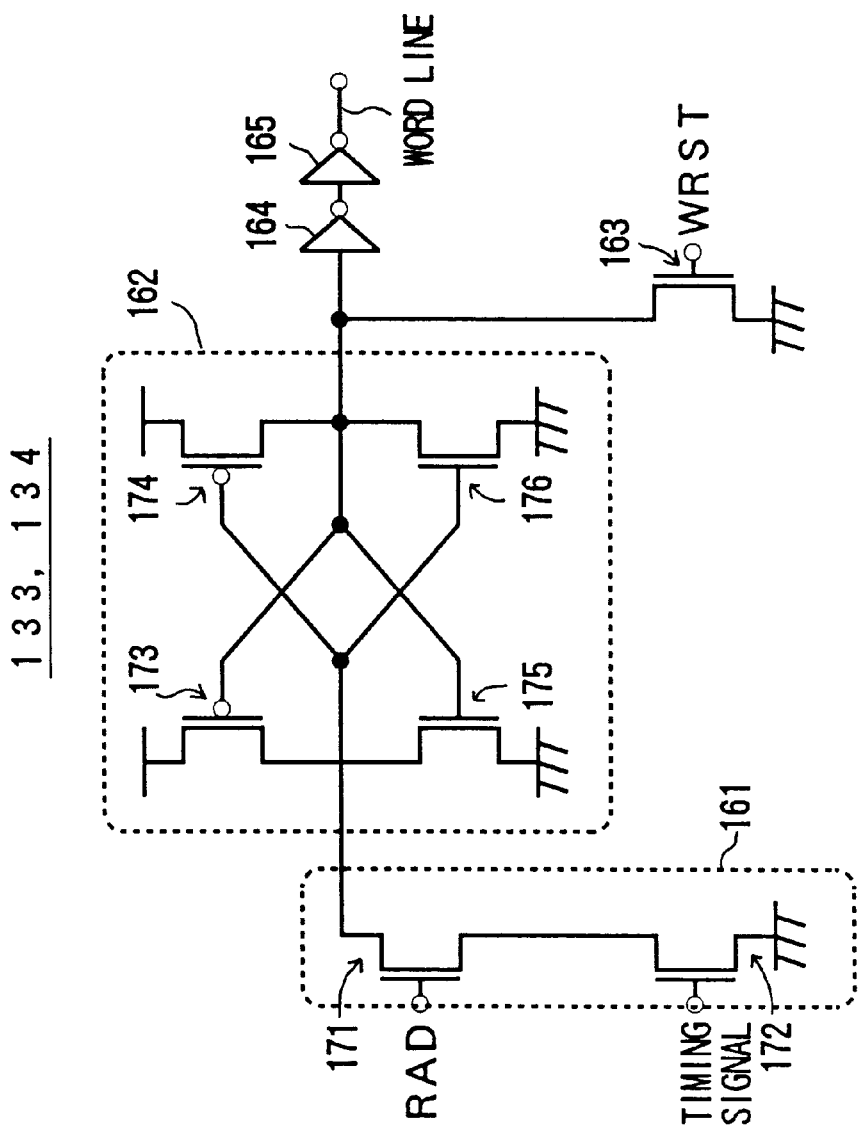
FIG. 14 is a circuit diagram showing one of a redundant-word driver and word drivers.
Figure 15:
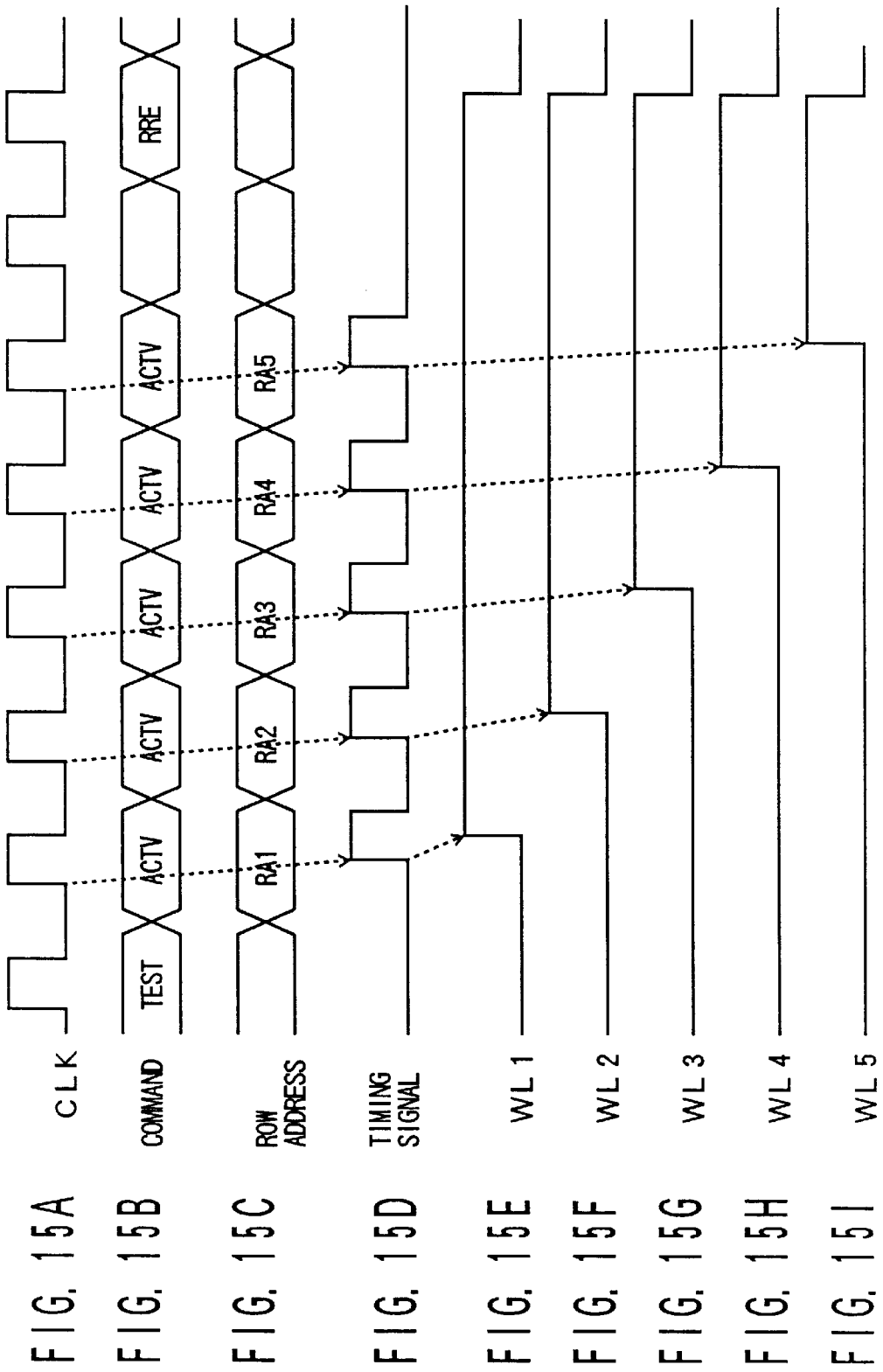
FIGS. 15A through 15I are timing charts showing operations regarding simultaneous activation of a plurality of word lines.

FIG. 14 is a circuit diagram showing one of the redundant-word driver 133 and the word drivers 134. The word driver 134 (or the redundant-word driver 133) of FIG. 14 includes a decoding unit 161, a latch 162, a NMOS transistor 163 for resetting the driver, and inverters 164 and 165. The decoding unit 161 changes an input to the latch 162 to LOW when both the rowaddress-decode signal RAD and the timing signal become HIGH. Upon receiving the LOW input, the latch 162 latches a HIGH output. The HIGH output of the latch 162 is supplied to a word line via the inverters 164 and 165.

The decoding unit 161 includes NMOS transistors 171 and 172. The latch 162 includes PMOS transistors 173 and 174 and NMOS transistors 175 and 176. The above described operations are performed by these transistors.

The word driver shown in FIG. 14 keeps outputting a HIGH-level voltage to the word line once the word driver is selected until the word driver is reset by a reset signal WRST. This makes it possible to activate a plurality of word lines at the same time during a time of memory-cell test. The reset signal WRST may be a signal which becomes HIGH in synchronism with the precharge operation.

FIGS. 15A through 15I are timing charts showing operations regarding simultaneous activation of a plurality of word lines.

After inputting a test command TEST to the semiconductor memory device MD of FIG. 11, a plurality of activation commands ACTV are successively input in order to activate word lines. Each time an activation command ACTV is input, a HIGH pulse of the timing signal is supplied to the timing-control unit 131 of FIG. 12 in synchronism with the clock signal CLK. Further, row addresses RA1 through RA5 are input in synchronism with the activation commands ACTV.

The HIGH pulses supplied to the timing-control unit 131 are then supplied to the redundant-word driver 133 or the word drivers 134. As a result, five word drivers corresponding to the row addresses RA1 through RA5 are successively selected, thereby changing corresponding word lines WL1 through WL5 to HIGH in sequence. The word lines WL1 through WL5 which are now at a HIGH level are then reset through a precharge command PRE.

In this manner, a plurality of word lines can be simultaneously activated at a time of the test operation.

The system of FIG. 10 is used for conducting a cell-defect-detection test with regard to the semiconductor memory device MD shown in FIG. 11 through FIG. 14.

Figure 16:
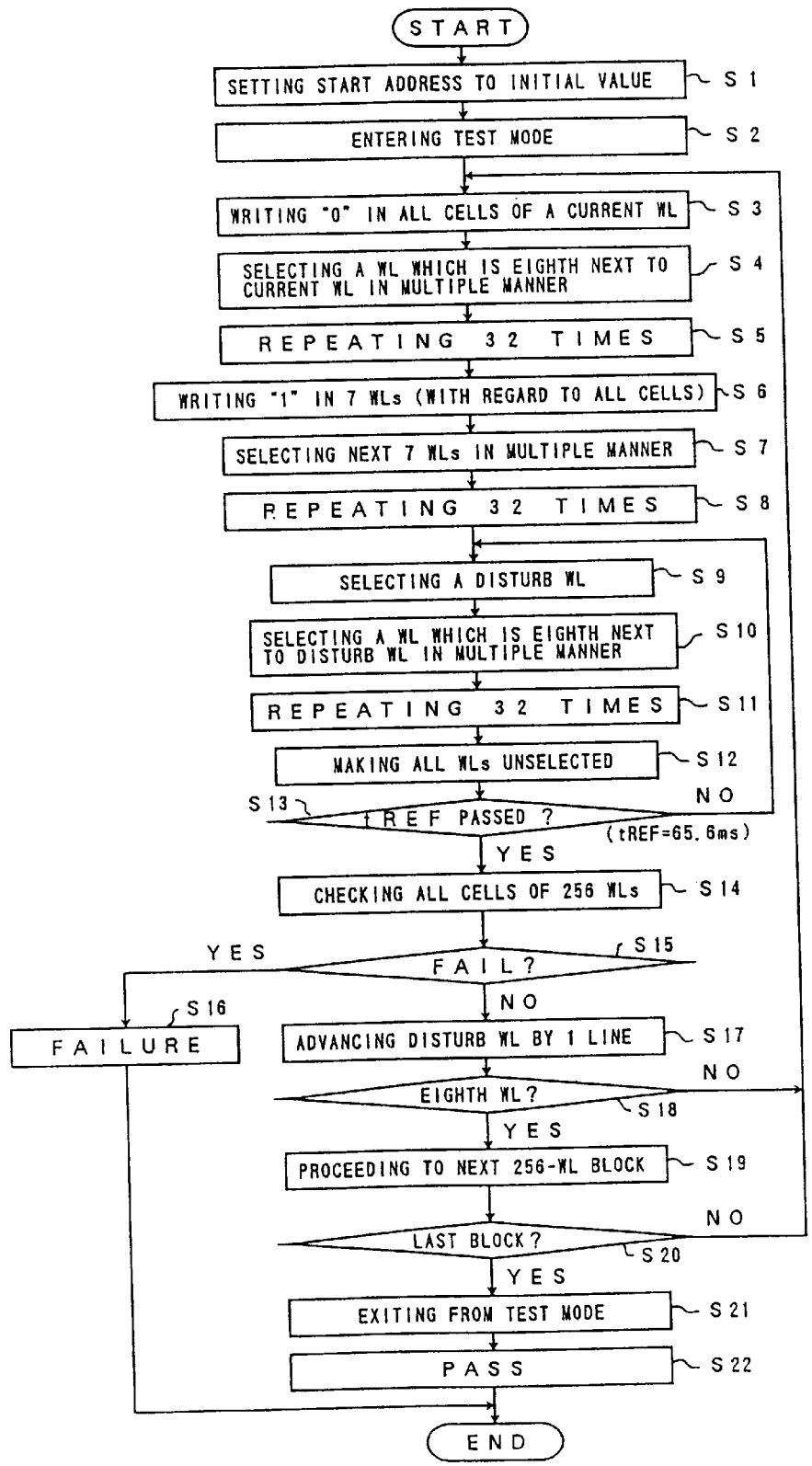
FIG. 16 is a flowchart showing a test of detecting cell defects according to the present invention.

FIG. 16 is a flowchart showing a test of detecting cell defects according to the present invention.

At a step S1, an address for conducting a test is set to an initial address.

At a step S2, a test mode is initiated.

At a step S3, data "0" is written in all the cells of a relevant word line.

At a step S4, a word line which is eighth next to the above-identified word line is activated as one of multiple selections.

At a step S5, the above operation is repeated thirty two times.

At a step S6, data "1" is written in all the cells with respect to the 7 intervening word lines.

At a step S7, the next set of 7 word lines is activated in a multiple manner.

At a step S8, the above operation is repeated thirty two times.

The steps described above complete the writing of a test pattern.

Figure 17:
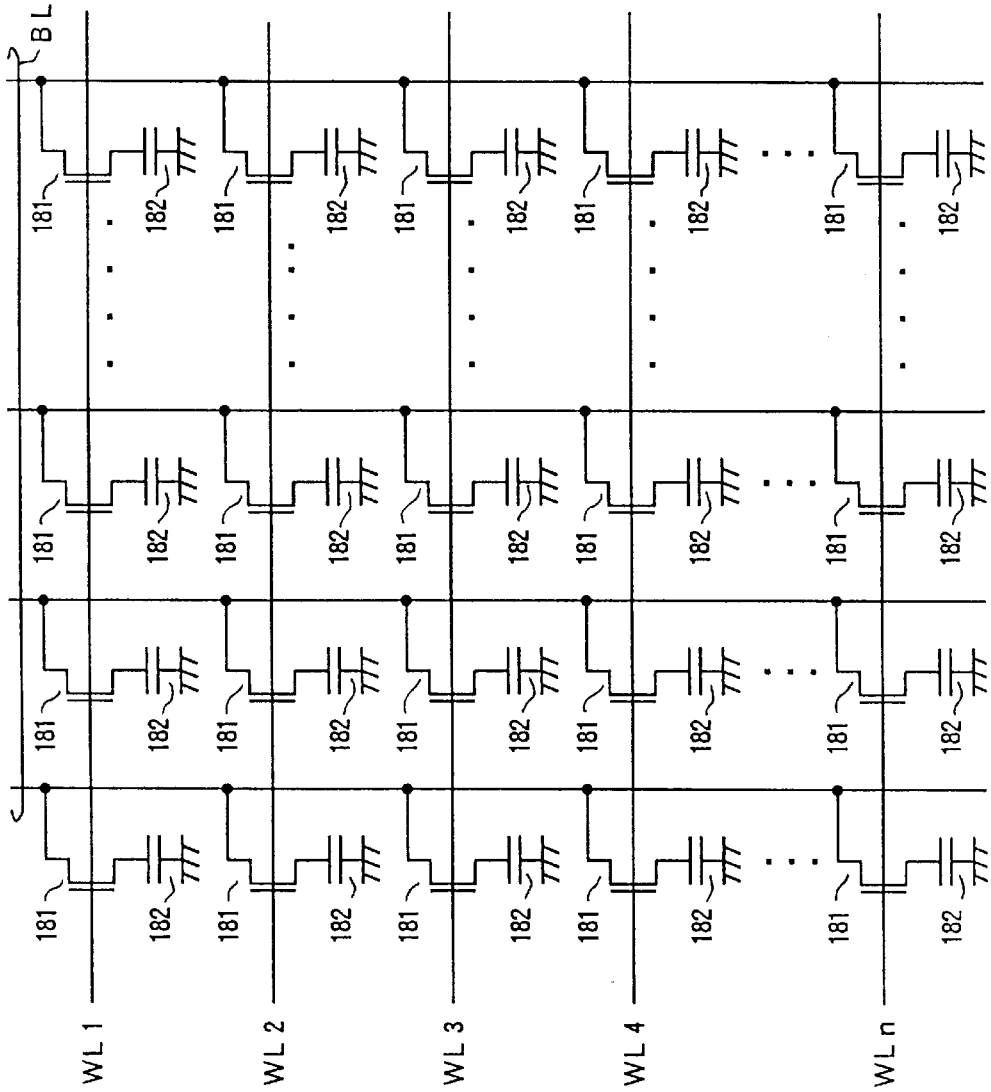
FIG. 17 is an illustrative drawing for explaining operations which selectively activate a plurality of word lines simultaneously.

FIG. 17 is an illustrative drawing for explaining operations which selectively activate a plurality of word lines simultaneously. As shown in FIG.17, each of the word lines WL1 through WLn is connected to a gate input of cell-gate transistors 181. When one of the word lines WL1 through WLn is selected and activated, the cell-gate transistors 181 connected to the selected word line are turned on. As the cell-gate transistors 181 are turned on, data stored in memory cells (capacitors) 182 are read to bit-lines BL. In the case of data writing, operations which are reverse to the above-described operations are performed.

Through the operations of the steps S3 through S8, data "0" is written in all the memory cells 182 with respect to the word lines WL1, WL9, WL17, . . . , and WL249, for example, when there are 256 word lines in total. Other word lines have the memory cells 182 in which data "1" is written.

With reference to FIG. 16 again, at a step S9, a disturb word line is selectively activated.

At a step S10, a word line which is eighth next to the disturb word line is activated in a multiple-selection manner.

At a step S11, the above operation is repeated thirty two times.

At a step S12, all the word lines are deactivated.

Through the above operations, 32 word lines, i.e., the word lines WL1, WL9, WL17, . . . , and WL249 in the example of FIG. 17, are successively selected and simultaneously kept in an active state. Then, all of these 32 word lines are simultaneously deactivated.

At a step S13, a check is made whether a time period tREF has passed. Here, the time period tREF is an interval of refresh operations conducted with respect to memory cells, and is 65.6 ms, for example. The reason why a passage of the time period tREF is checked is as follows. If no data change takes place even after the refresh time period tREF passes, there is no need to check operations of the semiconductor memory device for a longer time period since it can be ascertained that no errors should occur in actual operations. Further, the reason why activation and deactivation of the word lines are repeated may times at the steps S9 through S12 is that a time length during which the word line can be kept active is limited in practice. If a word line could be continuously kept in an active state for a sufficiently long time period, there would be no need to activate and deactivate it repeatedly.

At a step S14, all the cells of the 256 word lines are read.

At a step S15, a check is made whether the read data are equal to the written data. If not, the procedure goes to a step S16, where the product is rejected since cells causing a data mismatch should be defective cells. If all the read data are equal to the written data, the procedure goes to a step S17.

At the step S17, the disturb word line is shifted by one line. Namely, a next set of disturb word lines will be the word lines WL2, WL10, WL18, . . . , and WL250 in the example of FIG. 17.

At a step S18, a check is made whether the selected disturb line is the eighth word line. If the answer is YES, the procedure goes to a step S19. Otherwise, the procedure goes back to the step S3.

At the step S19, the test proceeds to a next word-line block comprised of another 256 word lines.

At a step S20, a check is made whether the block which has just been tested is the last block, i.e., whether the test is conducted with respect to all the blocks. If the answer is YES, the procedure goes to a step S21. If the answer is NO, the procedure goes back to the step S3.

At a step S21, the operation exits from the test mode.

At a step S22, the product is accepted as a good product. This ends the procedure.

In this manner, the procedure which repeats activation and deactivation of word lines with an aim of checking possible effects on surrounding cells can be simultaneously conducted for a plurality of rows of cell-array blocks by drawing on the multiple-word-line-selection functions, thereby reducing a time length required for the memory-cell-defect detection test. When 32 word lines taken from every eight word lines are selectively activated and subjected to multiple selections as in the above example, the time period required for the disturb operations can be reduced to 1/32. When 64 word lines selected from every four word lines are activated and subjected to multiple selections, the time length of the disturb operations can be reduced to 1/64.

A further reduction in the test time can be achieved by utilizing bank-interleave operations as will be described below.

In the semiconductor memory device MD of FIG. 11, a command ACT is input in order to activate a word line so that data is transferred from the memory cells of the memory-cell array 224 to a sense-amplifier line of the sense-amplifier/data-input-output-gate unit 223, and a command READ is input in order to transfer the data of the sense-amplifier line to the I/O-data buffer 204 via the data-input/output gate of the sense-amplifier/data-input-output-gate unit 223. Then, a command PRE is input for the purpose of precharging the bit-lines and deactivating the word line after the completion of the data-read operation.

When operations of this configuration are considered with regard to the flowchart of FIG. 16, the command ACT is input at the step S9 of FIG. 16, and a corresponding row address is specified, thereby selectively activating the disturb word line. Further, at the steps S10 and S11, other row addresses are indicated for the purpose of selective and multiple activation of word lines. Also, the command PRE is input at the step S12 to deactivate the word lines.

In order to perform a bank-interleave operation, the first bank 208 is selected, and a command ACT is input, so that 32 indicated word lines are successively and selectively activated, resulting in multiple activation of these word lines. Then, the second bank 208 is selected, and a command ACT is input, thereby achieving multiple activation of another 32 word lines. The same operations are performed up to the fourth bank 208.

When multiple word lines are activated in all of the four banks 208, the first bank 208 is selected again, and a command PRE is input to deactivate the selected word lines. After this, the second bank 208 is chosen, and a command PRE is input, so that the selected word lines are deactivated. The same operations are performed with respect to the third and fourth banks 208.

When activation and deactivation of word lines are performed in a bank-interleave manner as described above, the process of activating and deactivating word lines for the purpose of checking a possible effect on the surrounding cells undergoes a further time reduction. In detail, the time length required for this process can be down to 1/(number of banks.

In the following, a method of conducting a cell test for both the redundant cells and the real cells at the same time will be explained.

Figure 18:
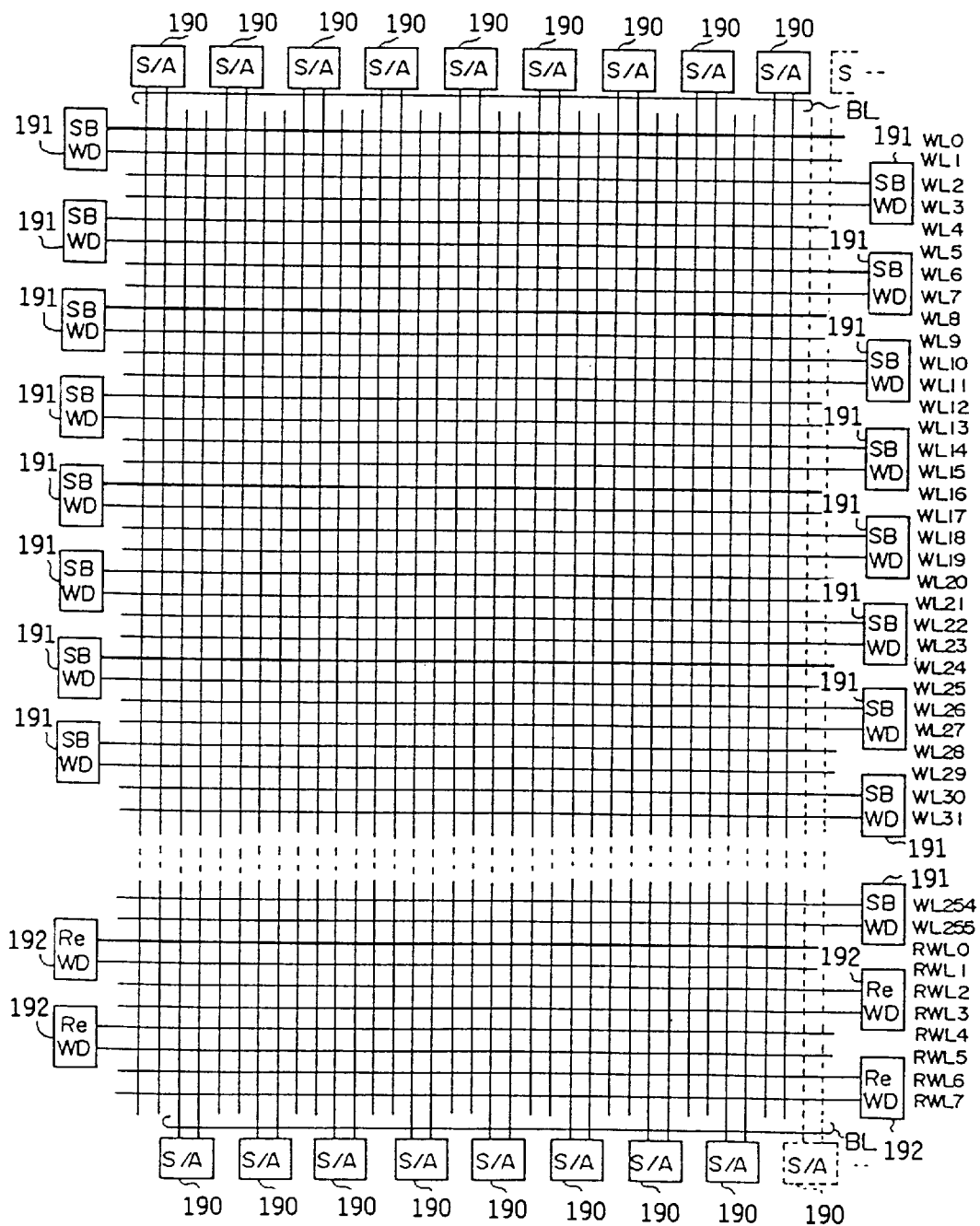
FIG. 18 is an illustrative drawing for explaining a cell test with regard to real cells and redundant cells.

FIG. 18 is an illustrative drawing for explaining a cell test with regard to real cells and redundant cells. FIG. 18 shows a single memory block, which includes 256 word lines WL0 through WL255 and 8 redundant word lines RWL0 through RWL7. When the real cells have a defect, a defective memory cell is specified based on a wired logic formed by cutting fuses. When an access is attempted to this defective memory cell, a redundant memory cell is accessed as an alternate.

In FIG. 18, data transfer is conducted via bit-lines BL between memory cells (not shown) and sense amplifiers 190 with respect to a word line selected by word decoders 191. By the same token, when redundant memory cells (not shown) are accessed, data transfer is performed via the bit-lines BL between the memory cells of a redundant word line selected by word decoders 192 and the sense amplifiers 190.

Figure 19:
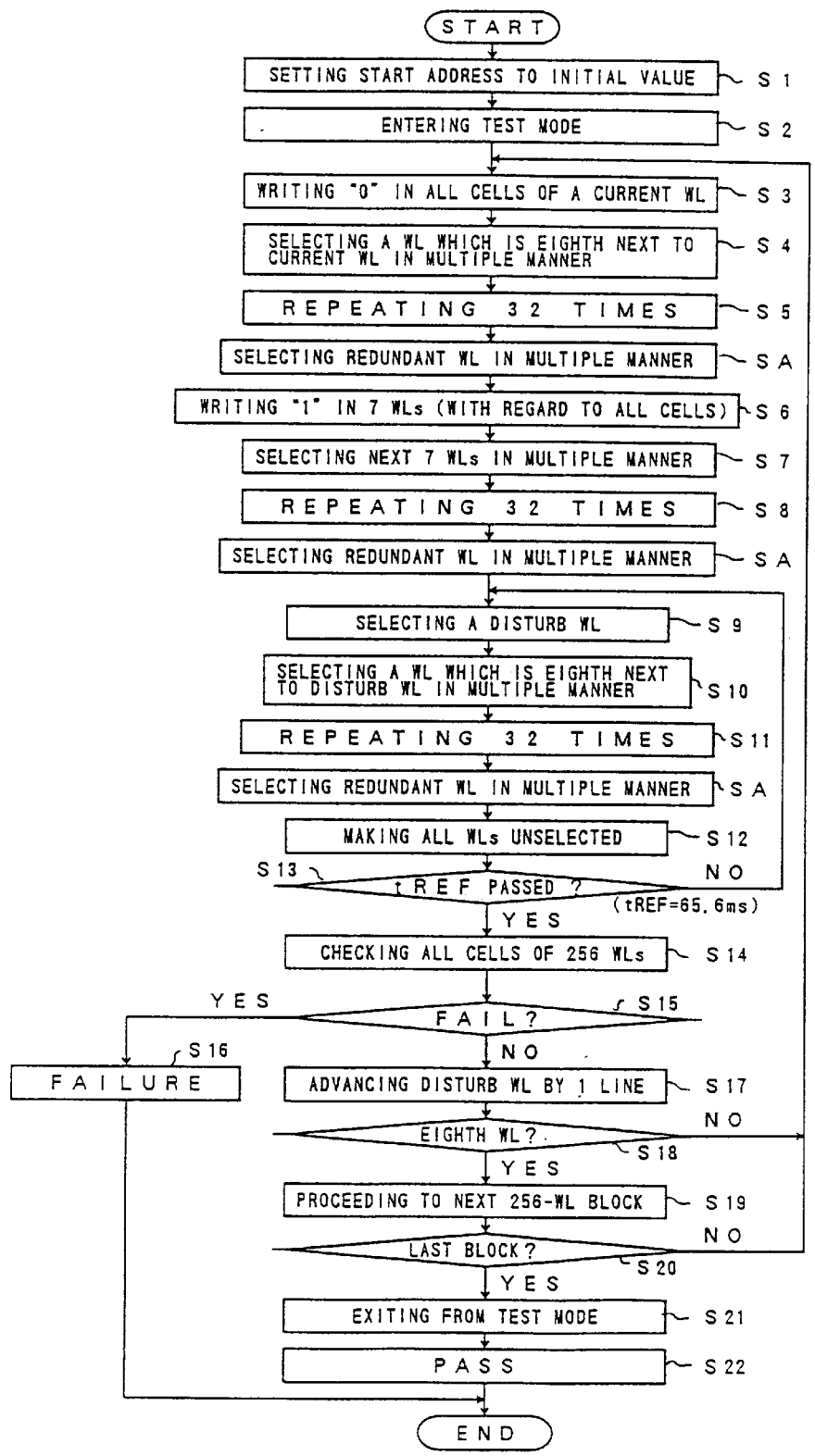
FIG. 19 is a flowchart showing a method of detecting cell defects with regard to the real cells and the redundant cells according to the present invention.

FIG. 19 is a flowchart showing a method of detecting cell defects with regard to the real cells and the redundant cells according to the present invention. With reference to FIG. 19, this test method will be described below.

At a step S1, an address for conducting a test is set to an initial address.

At a step S2, a word-line-multiple-selection-test mode is initiated.

At a step S3, data "0" is written in all the cells of a relevant word line.

At a step S4, a word line which is eighth next to the above-identified word line is activated as one of multiple selections.

At a step S5, the above operation is repeated thirty two times.

At a step SA after the step S5, a redundant word line is subjected to further multiple selection. Namely, one of the redundant word lines RWL0 through RWL7 is selectively activated in addition to the 32 word lines selected at the steps S3 through S5. This activated redundant word line is an eighth word line when word lines are counted from the last word line subjected to the original multiple selection. That is, when word lines WL0, WL8, WL16, ..., and WL248 are chosen as those of multiple selection, a redundant word line RWL0 is further activated as shown in FIG. 18.

At a step S6, data "1" is written in all the cells with respect to the 7 intervening word lines.

At a step S7, the next set of 7 word lines is activated in a multiple manner.

At a step S8, the above operation is repeated thirty two times.

The steps described above complete the writing of a test pattern. Namely, in the example of FIG. 18, the memory cells of the word lines WL0, WL8, WL16, ..., and WL248 and the redundant word line RWL0 have data "0" written therein, and the memory cells of other word lines and other redundant word lines have data "1" stored therein.

At a step S9, a disturb word line is selectively activated.

At a step S10, a word line which is eighth next to the disturb word line is activated in a multiple-selection manner.

At a step S11, the above operation is repeated thirty two times.

At a step SA after the step S11, a redundant word line is selected in a multiple-selection manner. This achieves multiple activation of this redundant word line and the previously activated word lines as disturb word lines.

At a step S12, all the word lines are deactivated.

Through the above operations, 33 word lines, i.e., the word lines WL0, WL8, WL16, ..., and WL248 and the redundant word line RWL0 in the example of FIG. 18, are selected and simultaneously kept in an active state. Then, all of these 33 word lines are simultaneously deactivated.

At a step S13, a check is made whether a time period tREF has passed. Here, the time period tREF is an interval of refresh operations conducted with respect to memory cells, and is 65.6 ms, for example. The reason why a passage of the time period tREF is checked is as follows. If no data change takes place even after the refresh time period tREF passes, there is no need to check operations of the semiconductor memory device for a longer time period since it can be ascertained that no errors should occur in actual operations.

At a step S14, all the cells of the 256 word lines and 8 redundant word lines (a total of 264 lines) are read.

At a step S15, a check is made whether the read data are equal to the written data. If not, the procedure goes to a step S16, where the product is rejected since cells causing a data mismatch should be defective cells. If all the read data are equal to the written data, the procedure goes to a step S17.

At the step S17, the disturb word line is shifted by one line.

At a step S18, a check is made whether the selected disturb line is the eighth word line. If the answer is YES, the procedure goes to a step S19. Otherwise, the procedure goes back to the step S3.

At the step S19, the test proceeds to a next word-line block comprised of another 256 word lines.

At a step S20, a check is made whether the block which has just been tested is the last block, i.e., whether the test is conducted with respect to all the blocks. If the answer is YES, the procedure goes to a step S21. If the answer is NO, the procedure goes back to the step S3.

At a step S21, the operation exits from the test mode.

At a step S22, the product is accepted as a good product. This ends the procedure.

Figure 20:
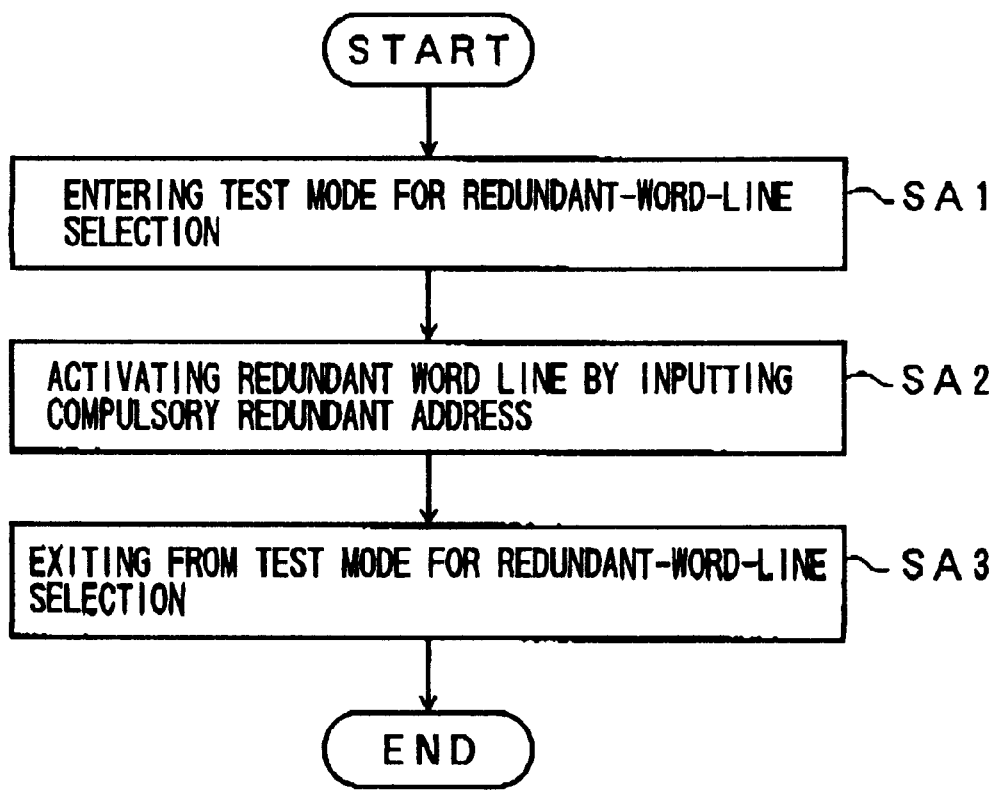
FIG. 20 is a flowchart showing a process of making multiple selection of redundant word lines.

FIG. 20 is a flowchart showing a process of making multiple selection of redundant word lines (i.e., the step SA of FIG. 19).

In order to make multiple selection of redundant word lines, at a step SA1, a test mode for redundant-word-line selection is initiated.

As was described with reference to FIG. 2, the test-mode decoder 210 decodes the address signals from the address buffer 203 when the test-mode-check circuit 209 finds that the device is in the test-operation mode. A bit pattern of the address signal is used for specifying the contents of the test operation. Namely, the bit pattern of the address signal controls the test operations as to whether the multiple-word-line selection is made by the word-line-multiple-selection unit 211 and/or whether redundant word lines are tested by using the redundant-word-line-selection unit 212. When a plurality of test modes are employed simultaneously, each test mode is indicated one by one in sequence. Since the multiple-word-line-selection test mode has been already initiated at the step S2 of FIG. 19, the step SA1 only specifies the redundant-word-line-selection test mode.

At a step SA2, a redundant word line is activated by inputting a compulsory redundant address. In detail, an active command is input, and, at the same time, a compulsory redundant address is supplied so as to specify a redundant word line which is to be forcibly activated. This achieves a selective activation of the specified redundant word line.

At a step SA3, the redundant-word-line-selection test mode is brought to an end.

Through the processes of FIG. 19 and FIG. 20, a disturb test which performs disturb operations with respect to every eight word lines can be conducted not only for the word lines of the real cells but also for the redundant word lines of the redundant cells simultaneously.

The above description has been given by taking an example in which a disturb word line is selected from every eight word lines. It should be noted, however, that a similar test can be conducted at any appropriate disturb-word-line intervals, e.g., with respect to every four word lines instead of every eight word lines.

Further, the present invention is not limited to these embodiments, but various variations and modifications may be made without departing from the scope of the present invention.

What is claimed is:

1. A semiconductor memory device capable of conducting test operations, said semiconductor memory device comprising:
  a plurality of word drivers, each of which is connected to a word line and includes:
    a timing-signal node for receiving a timing pulse;
    a reset-signal node for receiving a reset signal; and
    a latch configured to latch a state of selection of a corresponding word driver at a timing indicated by said timing pulse so as to keep said word line in an active state, said latch being reset when said reset-signal node receives a reset signal; and a control circuit which successively selects more than one of said plurality of word drivers so as to achieve simultaneous activation of word lines corresponding to selected ones of said plurality of word drivers during said test operations.

2. The semiconductor memory device as claimed in claim 1, wherein said control circuit supplies said timing pulse to said plurality of word drivers.

3. The semiconductor memory device as claimed in claim 2, wherein said control circuit comprises a word-line-multiple-selection avoiding circuit which receives a timing signal indicating said timing to activate said word lines, and outputs said timing signal as said timing pulse, said word-line-multiple-selection avoiding circuit being able to be reset, wherein said word-line-multiple-selection avoiding circuit outputs said timing pulse at every occurrence of said timing signal during said test operations, and outputs said timing pulse only at a first occurrence of said timing signal by avoiding outputting said timing pulse at second and following occurrences of said timing signal during normal operations until a reset is made.

4. The semiconductor memory device as claimed in claim 1, wherein said reset-signal node receives said reset signal when a precharge command is input to said semiconductor memory device.

5. The semiconductor memory device as claimed in claim 1, wherein said plurality of word drivers include at least one redundant-word driver, said at least one redundant-word driver being selected when a row address of a defective memory cell is indicated.

6. A method of testing memory cells in a semiconductor memory device, said method comprising the steps of:

providing a latch for each word driver which activates a word line, said latch being set at a timing of a timing pulse when selecting a corresponding word driver to activate a word line;

setting a latch of at least one word driver to selectively activate at least one word line;

writing data in memory cells corresponding to said at least one word line;

resetting said latch of said at least one word driver to deactivate said at least one word line;

setting latches of more than one word driver successively at timings of successive timing pulses to achieve simultaneous activation of more than one word line in proximity of said at least one word line;

resetting the latches of said more than one word driver at a reset timing of a reset signal to achieve simultaneous deactivation of said more than one word line;

repeating the activation and the deactivation of said more than one word line; and reading data from said memory cells by activating said at least one word line.

7. A method of testing memory-cell defects, said method comprising the steps of:

a) successively activating a plurality of word lines in such a multiple manner as to keep said plurality of word lines simultaneously in an active state by utilizing a semiconductor memory device of claim 1; and b) checking whether there is a data change in memory cells corresponding to word lines surrounding said plurality of word lines.

8. The method as claimed in claim 7, wherein said step b) comprising the steps of:

b1) writing data in said memory cells before successively activating said plurality of word lines in said multiple manner;

b2) reading data from said memory cells after successively activating said plurality of word lines in said multiple manner; and b3) checking whether read data matches written data.

9. The method as claimed in claim 7, wherein said step a) comprises a step of repeating a successive and multiple activation of said plurality of word lines and a simultaneous deactivation of said plurality of word lines.

10. The method as claimed in claim 9, wherein said step a) is performed for a time duration substantially equivalent to a refresh cycle regarding memory cells.

11. The method as claimed in claim 10, wherein said step a) comprises the steps of:

a1) successively activating a plurality of word lines in said multiple manner in one of banks;

a2) performing said step a1) with respect to remaining ones of said banks;

a3) simultaneously deactivating a plurality of activated word lines in one of said banks; and a4) performing said step a3) with respect to remaining ones of said banks.

12. The method as claimed in claim 7, wherein said step a) further comprises a step of activating at least one redundant word line so as to keep said at least one redundant word line in an active state in addition to said plurality of word lines.

* * * * *